United States Patent
Chowhan

(10) Patent No.: US 11,227,375 B2
(45) Date of Patent: Jan. 18, 2022

(54) MACHINE VISION AND MACHINE INTELLIGENCE AIDED ELECTRONIC AND COMPUTER SYSTEM FOR ASSISTING ON FORMATION DRILLING, BORING, TUNNELING ON-LINE GUIDANCE, ASSISTED DECISION AND DULL GRADING SYSTEM FOR DRILLING TOOL AND ASSOCIATED DRILL STRING COMPONENTS

(71) Applicant: Tushar Chowhan, Navi Mumbai (IN)

(72) Inventor: Tushar Chowhan, Navi Mumbai (IN)

(73) Assignee: Tushar Chowhan, Navi Mumbai (IN)

( * ) Notice: Subject to any disclaimer, the term of this patent is extended or adjusted under 35 U.S.C. 154(b) by 0 days.

(21) Appl. No.: 16/761,499

(22) PCT Filed: Nov. 5, 2018

(86) PCT No.: PCT/IN2018/050713
§ 371 (c)(1),
(2) Date: May 4, 2020

(87) PCT Pub. No.: WO2019/087213
PCT Pub. Date: May 9, 2019

(65) Prior Publication Data
US 2021/0174486 A1    Jun. 10, 2021

(30) Foreign Application Priority Data
Nov. 6, 2017    (IN) .............................. 201721039419

(51) Int. Cl.
*G06T 7/00* (2017.01)
*G06T 7/70* (2017.01)
(Continued)

(52) U.S. Cl.
CPC ............ *G06T 7/0002* (2013.01); *E21B 12/02* (2013.01); *E21B 47/002* (2020.05); *G06F 30/10* (2020.01);
(Continued)

(58) Field of Classification Search
None
See application file for complete search history.

(56) References Cited

U.S. PATENT DOCUMENTS

2016/0032717 A1\* 2/2016 Parker .................... E21B 47/01
367/7
2018/0238164 A1\* 8/2018 Jamison ............... G06N 3/0472

OTHER PUBLICATIONS

David Kerr et al. "Assessment and visualization of machine tool wear using computer vision", Apr. 2006, URL: http://link.springer.com/article/10.1007/s00170-004-2420-0 [retrieved on Nov. 2, 2019] Abstract, headings 3 Tool wear measurements, 4 Image analysis.
(Continued)

*Primary Examiner* — Leon Flores
(74) *Attorney, Agent, or Firm* — Praveer K Gupta

(57) ABSTRACT

An electronic system is disclosed comprising of a drill tool which is mounted on a mechanical system with either a position and angular sensor assisted guidance of the camera itself around the drill tool in a guided trajectory as in a robotic arm or mobile device on the field with the drill tool pulled out from the wellbore or when the tool can be imaged while in operation; multiple fixed cameras on a test or working rig coupled with rotary control of the drill tool, and a controller capable of controlling the drill string motor and imaging. The system automatically profiles the degraded/worn out drill tool, when the drill string-drill tool is visually available or pulled out, by executing a host of machine vision engineering based and machine intelligence/data analytics engineering algorithms, where the algorithms can
(Continued)

calculate and provide detailed current/predictive and prescriptive analysis of the drilling tool.

32 Claims, 18 Drawing Sheets

(51) Int. Cl.
*G06F 30/10* (2020.01)
*G06F 30/27* (2020.01)
*E21B 47/002* (2012.01)
*E21B 12/02* (2006.01)
*G06K 9/62* (2006.01)
*G06N 3/08* (2006.01)
*G06T 7/20* (2017.01)

(52) U.S. Cl.
CPC .......... *G06F 30/27* (2020.01); *G06K 9/6288* (2013.01); *G06N 3/08* (2013.01); *G06T 7/20* (2013.01); *G06T 7/70* (2017.01); *E21B 2200/20* (2020.05); *E21B 2200/22* (2020.05)

(56) References Cited

OTHER PUBLICATIONS

S. Dutta et al. ,"Application of digital Image processing in tool condition monitoring: A review", 2013, URL: https://www.sciencedirect.com/science/article/abs/pii/S1755581713000072 [retrieved on Nov. 2, 2019] Whole document.

International Search Report for PCT/IN2018/050713 dated Dec. 2, 2019.

* cited by examiner

Illustrates the Machine Intelligence Aided: Analysis and Guidance

MACHINE VISION AND MACHINE INTELLIGENCE AIDED ELECTRONIC AND COMPUTER SYSTEM FOR ASSISTING ON FORMATION DRILLING, BORING, TUNNELING ON-LINE GUIDANCE, ASSISTED DECISION AND DULL GRADING SYSTEM FOR DRILLING TOOL AND ASSOCIATED DRILL STRING COMPONENTS

TECHNICAL FIELD

The present invention generally relates to an electronic/computer system which is based on the machine vision, engineering analytics and artificial intelligence, and more particularly an electronic/computer system which can be used to provide on-field diagnostics, analysis and online guidance for drilling tools in various formation The present invention generally relates to an electronic/computer system which is based on the machine vision, engineering analytics and artificial intelligence, and more particularly an electronic/computer system which can be used to provide on-field diagnostics, analysis and online guidance for drilling tools in various formation drilling operations, also with assisted decision making and dull grading system.

BACKGROUND ART

Drilling systems are employed for drilling wellbores into subterranean formations to retrieve hydrocarbon fluids, such as oil and natural gas. The drilling systems may comprise a drill string having a plurality of drill tools which may be used to carry out the drilling operation. For example, drill tools are usually rotated and are forced to cut through the formation to carry out the drilling operation. The drill tool is controlled and guided with precision and supplied with drilling fluid to drill through the desired path. The drill string and drill tools may be used for successive drilling jobs; however, difficulties arise in determining the health of a given drill tool, particularly mid-way of a drilling operation and when the drill tool is to be reused for a new job.

The formation drilling industry including for Oil and Gas is seeing a fundamental transformation where sophisticated robotics and software, are taking over the rig floor, leading to automation of most of the manual and dangerous jobs, such as running steel pipe down the wells, driving attachments to the rigs and manually making decisions during drilling. Such works typically requires minimum of four or five workers, and there is now a shift to get this work done with a push of a button, which is having increased efficiency, reduced manpower, cost and it also dramatically reducing the risk of injuries near the wellhead. This is a paradigm shift that is in line, and catching up with the manufacturing and other industries that have become increasingly automated and highly efficient.

The efficiency of a drilling system is dependent on the handling and health of the individual component of the drilling assembly and also on the efficient operation of the drilling system as a whole. Continuous, repetitive and recycled operation of the drilling components and tools leads to wear and tear of the mechanical system, thus degrading its operation ability. It is important that the system be inspected, evaluated and weighed accurately for current and future use.

The drilling system and its assemblies typically include drill bit/drill pipes/drill collars/stabilizers/reamers/BHA components and many others. Thus, with the pace of automation and a need to become efficient, the system has to be fault safe and cost effective, and a need to have an automated assessment system that can help in making decisions on further usage of a worn or degraded mechanical component. This requires an electronic machine vision, intelligence based, engineering system to guide the tactical and manual decision-making effort on the rig floor.

An automated drill rig is a basically a completely automated full-sized land/sea-based drill rig that drills long lateral sections in vertical, directional or horizontal wells for the oil and gas and other industry, using robotics and automated systems.

In a drilling system, the drill bit is the front-end, critical and a complex tool used to drill (vertically, horizontally or directionally) a well bore through different complex formations for thousands of feet in most drilling or boring applications. The drilling tool is usually constructed of many blocks/heads or blades consisting of a multitude of organized cutters or inserts of engineered shapes, composition and characteristics. These cutters (typically about 50-250 in number) participate in conjunction to remove a volume of the formation as the drill tool drills ahead. As the drilling tool drills these cutter or indenters wear and progressively (or in some cases abruptly) loose a part of it cutting volume/shape, significantly altering the performance of the drilling tool.

The future behavior, operation characteristics and efficiency of the drilling tool is characterized by the state, profile and the way these cutters/inserts along with its holding blade/blockheads have worn or degraded. The current health and future proper operation of the drill tool at various stages of drilling is of paramount importance in ensuring fail safe, efficient, optimal and cost-effective drilling of the formation well bore.

Drilling Operators want to ensure both, either a newly employed or a partially used drill bit/tool is fit and up to the mark for the drilling session ahead. In the case of a midway drill session, dull grading the condition of a rock bit when it comes out of the hole is an important field operation that is often overlooked. At many times, the decision to change the bit is left up to the driller, with very little guidance given. This means that most bits get changed only after they're completely worn out, and after they have been operating at low efficiency for a significant length of time.

The operator can save a great deal of time and money if he is guided by a system that automatically inspects the drill tool and system, grades the used tool and provides detailed analysis of the current status and future ability of the drill tool in various operating scenarios including coupled to a rotary steerable system for directional drilling.

Further it can be of great use if the system can provide a guidance to the operator by inspecting the current state of the drill tool, look up the real-time history of the drilling operation so far, and provide the driller guidance on measuring the performance of drilling; analysis to verify if the current drill tool was right for the application; check the current state and health of the drill bit and a critical evaluation if a change in drill bit/tool is required. It will be also of great use if the system can provide analysis on the future performance of the drill bit/tool, guidance from history on the optimal drill bit for the session drilled so far; and evaluation/analysis for reason if the drill bit/tool has failed; and many more. Information collected about the drill bit in conjunction with various real-time logs and data acquired is also of great assistance to the drill bit manufacturer as feedback to evaluate and improve on his design ahead.

Currently there is no instantaneous, auto-inspecting, manufacturer neutral, drill tool/component analysis and guidance solution. Existing solutions do not (precisely) visualize and characterizes the wear on the cutters/indenters and the drill tool as a whole, for analyzing past, current and future drill tool operation while the drill tool/assembly is pulled out or available for visual inspection.

As mentioned the drilling industry is now transforming itself to the use of robotics and automation to reduce cost, manpower and mitigate hazardous operating conditions used on the rig floor for drilling. To achieve this, it is important that the system also auto inspects the drill tool/drilling components and provide guidance on further usage for optimal drilling.

A typical drill tool (drillbit/underreamer) is run through a wellbore hole, two to three or more times in its life span. While in its first run, the drillbit being new, its performance and drilling capability is predictable and follows manufacturer's specifications. In later stages under various uncertain operating and formation conditions the drill tool wears and degrades impacting its future operability and predictability that becomes a big question mark. This degradation further critically influences the outcome of the overall drilling process in terms of high cost, reduced efficiency, accuracy and prolonged timespan.

In the case of PDC Drill Bit and Underreamer as the cutter undergo wear and tear and develop a wear flat, further usage of the Drill tool may lead to the following consequence:

a. the rate of penetration can slow down significantly forcing the drilling operator to apply more weight on bit, in turn accelerating the wear and reducing the life span of the drill tool itself
b. requires a much higher Weight on Bit or Weight on Reamer in some case up to four to six times the original required Weight.
c. experiences a reduction in the well bore drilled diameter as shoulder cutters and trimmers wear.
d. can experience unbalanced side force leading to whirl, vibration and instability of the drilling tool.
e. reduced precision of the tool drilling trajectory more so while drilling directionally.
f. reduced life span and susceptible to abrupt failure
g. reduced Mechanical Specific Efficiency Hence it is critically important that drill tool status and health be evaluated whenever possible and deep analyzed to diagnose for the above-mentioned issues. While there has been much advancement in how real time down hole drill tool (and the drill string) data is acquired via downhole sensors, processed and interpreted. The mechanism of profiling and analyzing a pulled-out drill bit has remained based on human observation and mechanical, which is prone to error and limited in its application. In summary dull grading a drill tool remains a manual activity.

Further, despite improving the ability to consistently drill the formation in a single run, the field operator has to run the tool at-least three to four times to accomplish the job. Each time the drill-tool is pulled out, the operator is responsible to evaluate the health of the tool before carrying out further drilling. Continuous, repetitive and recycled operation of the drilling components and tools leads to wear and tear of the mechanical system, degrading its operation ability. It is important that the system be inspected, deep analyzed with a human error free mechanism, and assessed accurately for current and future use.

Also, Drill Tool manufacturers do not have a real-time feedback system (with a repository) that can automatically inspect and characterize how well their drill tool performed including for certain operating conditions of the well bore and further automatically assist with valuable analysis and guidance to evaluate and improve on their design ahead.

Artificial Intelligence based technology coupled with Image Processing algorithms, mobile and cloud computing has now evolved exponentially and have become adaptable for engineering application that require intense analysis.

Thus, with the pace of automation and a need to become efficient, fault safe and cost effective it is now necessary to have an automated system that can help in making decisions on further usage of a worn or degraded drilling tool. This requires an electronic machine vision, intelligence based, engineering system to guide the tactical and manual decision-making effort on the rig floor.

SUMMARY OF INVENTION

The present invention provides an electronic system for assisting on formation drilling/boring/tunneling on-line guidance, analysis, assisted decision and dull grading system for drilling tool and associated drill string components. The electronic system provides an easy and advanced solution to the existing problems by providing an intelligent engineering machine vision system, which guides a set of intelligent camera setup on the rig floor or in a test environment.

According to the present invention, a mobile device equipped with video and high-resolution imaging camera and positioning sensors is guided on a path around the drill-tool (manually or automated by a robotic arm) such that the tool is imaged and visualized in multiple views recognizing and analyzing its various features (blades, cutters, nozzles) including faults, degradation and wear & tear. Our system further processes the captured views of the tool to build a geometrical model for detailed engineering analysis.

In another embodiment of the present invention, the drill tool is mounted or held on a mechanical system with either three cameras placed at 120 degrees to each other, or a dual differential camera coupled with rotary control of the drill tool, in a drill tool test offline setup. The electronic system also comprises of a controller which is capable of controlling the drill string motor and imaging, and also aids in continuously analysis of the drill tool by visualization. The imaging system has zoom in and zoom out functions with focus on the various features. The system can control the cameras and possibly the drill string rotation, which eases the process.

The present invention provides an intelligent engineering machine vision electronic system, which automatically profiles the degraded/worn out drill tool, when the drill string-drill tool is visually available or pulled out, by executing a host of machine vision engineering based and machine intelligence/data analytics engineering algorithms.

The algorithms can calculate and provide a detailed current/predictive and prescriptive analysis of the drilling tool. Further, the system guides the drilling operator and the driller on future use and performance of the drill tool. The system also automatically generates a dull grade report along with a detailed analysis of the tool and sends it to a central database for historical persistence and further processing as an intelligent sensor.

The present invention further provides a system for automatic analysis, inspection and diagnostics of the drill tool to detect vulnerable and susceptible areas in the design and mechanical construction of the drill tool by correlating to available drilling logs and further recommending changes and improvement to the tool design to improve performance and efficiency.

DESCRIPTION OF THE EMBODIMENTS

Methods, apparatus and systems for monitoring, evaluation, analysis of drilling tool on the field or in a test environment using imaging and sensor fusion positioning information via a smart phone camera, a robotic arm with camera or a fixed camera setup are described. In the following description, numerous specific details are set forth. However, it is understood that embodiments of the invention may be practiced without these specific details and that numerous variations or modifications from the described embodiments may be possible.

Embodiments allow for imaging, sensing position, monitoring, evaluating, analyzing of the health, status and operation of various types of formation drill tools and associated drilling operation on the field itself.

Embodiments further allow for imaging, monitoring, evaluating, analyzing the robustness of the design and operation of the drill tool to various subjected operating condition on the field, and in an automated manner recommend changes, improvement and addition to the drill tool design for better operation in future.

Embodiments, post imaging and processing will generate various graphical and numerical output of data as an intelligent sensor modelling the status, health, wear and tear, degradation and geometric model of the imaged drill tool The present invention discloses a drilling system in which the drill bit is the front-end, critical and a complex tool used to drill (vertically, horizontally or directionally) a well bore through different complex formations for thousands of feet in most drilling or boring applications. The drilling tool is usually constructed of many blocks/heads or blades consisting of a multitude of organized cutters or inserts of engineered shapes, composition and characteristics. These cutters (typically about 50-250 in number) participate in conjunction to remove a volume of the formation as the drill tool drills ahead. As the drilling tool drills these cutter or indenters wear and progressively (or in some cases abruptly) loose a part of it cutting volume/shape, significantly altering the performance of the drilling tool.

The future behavior, operation characteristics and efficiency of the drilling tool is characterized by the state, profile and the way these cutters/inserts along with its holding blade/blockheads have worn or degraded. The current health and future proper operation of the drill tool at various stages of drilling is of paramount importance in ensuring fail safe, efficient, optimal and cost-effective drilling of the formation well bore.

Figure 1:
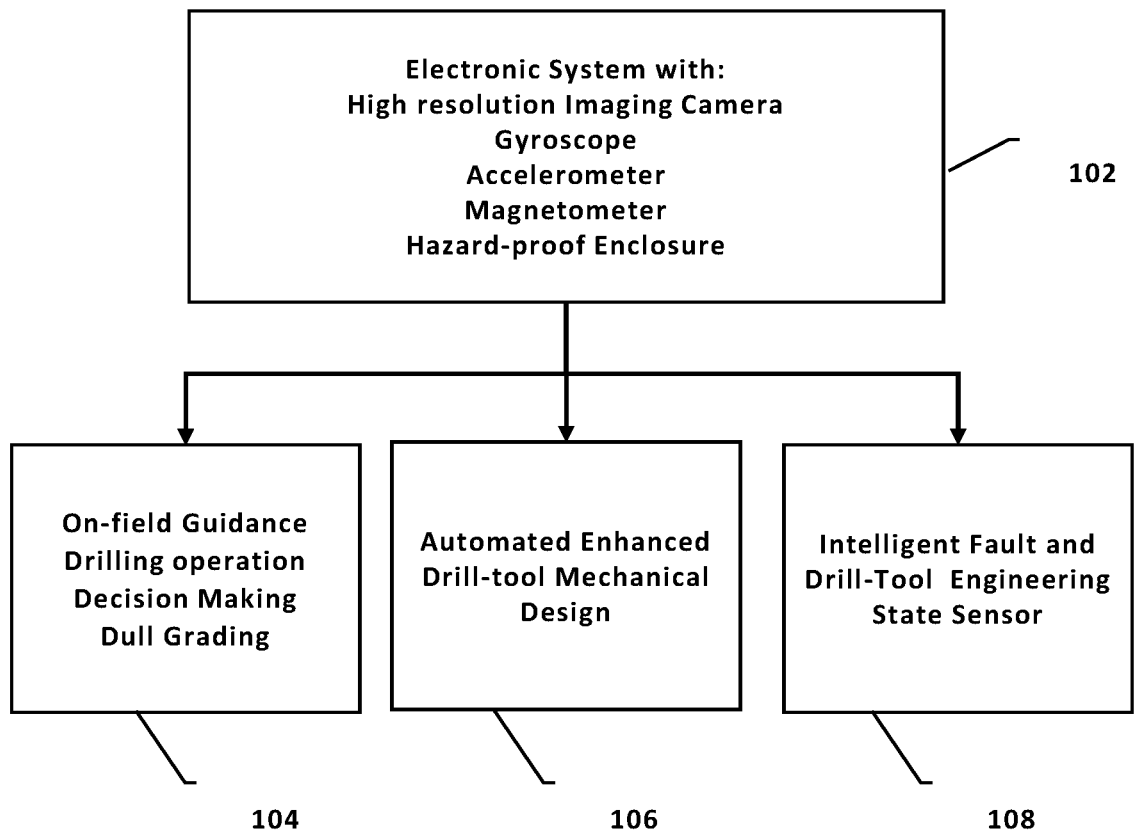
FIG. 1 illustrates the three major functionality of the electronic system that analyses a formation drilling tool for providing: On-field guidance and decision-making system for the drilling operation, as an improvement system with field feedback to enhance the mechanical design of the drill tool, and work as an intelligent sensor to provide detailed health, status and engineering information on state of the drill tool to other analysis system and software.

FIG. 1 illustrates the three major functionality of the electronic system that analyses a formation drilling tool for providing: On-field guidance and decision-making system for the drilling operation, as an improvement system with field feedback to enhance the mechanical design of the drill tool, and work as an intelligent sensor to provide detailed health, status and engineering information on state of the drill tool to other analysis system and software. According to FIG. 1, the electronic system 102 can visualize the formation drill tool using its imaging camera and uses its positioning sensors to perform deep engineering analysis on the current status of the tool, helping to provide the following functionality: 104 provides on-field guidance, decision making on the current and future drilling ability of the drill tool; 106 detects vulnerable and improvement areas in the design of the drill tool and recommends changes on the mechanical construction of the drill tool and 108 acts as an intelligent sensor to sense and provide information on the various state changes, faults, deformation, degradation and wear and tear that have occurred on the drill tool for further processing.

Figure 2:
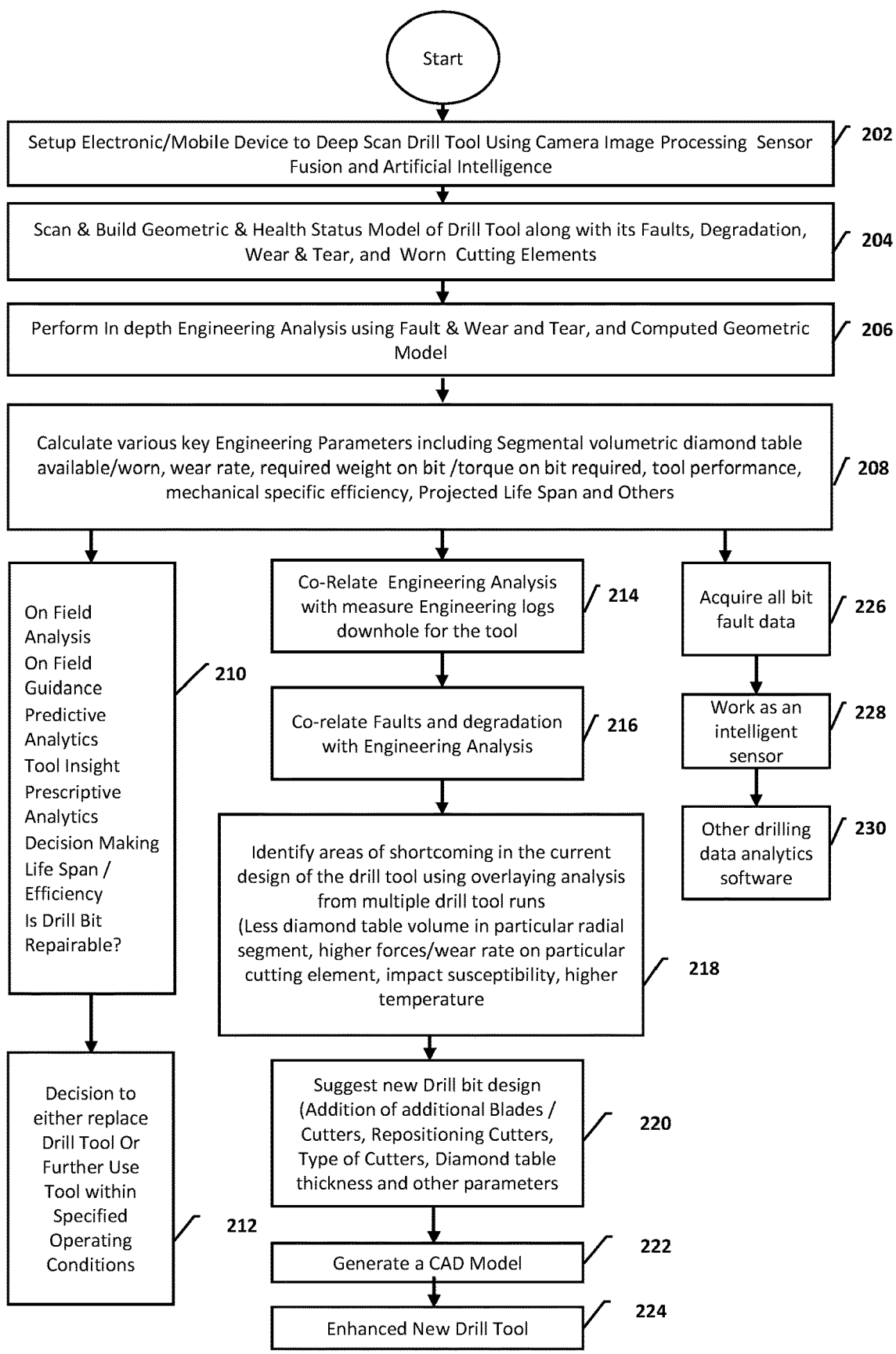
FIG. 2 illustrates a flow schematic presenting details of the three major functionality of the electronic system as presented in FIG. 1.

FIG. 2 illustrates a flow schematic presenting details of the three major functionality of the electronic system as presented in FIG. 1. According to FIG. 2, the schematic diagram discloses detailing of the common and unique steps required to implement the three major functionality of the electronic system as presented in FIG. 1. Referring to FIG. 2, the electronic system has to be initialized, with its high-speed video and high-resolution photo mode camera calibrated and other sensors namely gyroscope, accelerometer, gravitational sensor and magnetometer, and LED flash initialized and calibrated, as per 202. The artificial intelligence neural network that has been trained earlier on the various conditions and states of the drill tool is loaded and initialized. The electronic system requires to be guided in a pre-programmed trajectory from top (face) view around the drill tool, capturing multiple images of the drill tool in different orientation while sensing and recording other inertial and position sensor information and position co-ordinates, as per 204. Further the system utilizes Image processing to profile the captured images for various contours and image moment, and other calculations coupled with artificial intelligence recognition. The system also co-relates with sensor acquired angular and linear position and velocity/acceleration information of the device and performs image processing to determine the absolute geometric position of the components of the drill tool, and the location of the various deformation and faults generated on the tool. Artificial Intelligence based image classification and image segmentation is used to detect and recognize the various types of faults and deformation that have occurred on the drill tool as a result of drilling.

As per 206, the geometric information generated in particularly for the cutting elements and its wear and tear in terms of wear contour and wear flat area contour be transmitted to analysis module. The analysis module further builds a cutting element interaction plot, such that the cutting element contour along with its wear contours are profiled for discretized segmental analysis to compute for a single rotation at given depth of cut. Further, the cutting element face area and wear flat area participating for each cutting element for removal of formation are calculated. The cutting face area and wear flat area is further utilized to compute various forces required or generated at the cutting element.

According to FIG. 2, 208 requires the computed forces for each cutting element and its segment be further integrated and transformed to calculate the overall key engineering parameters for the drill tool. Parameters computed include Total Segmental-Radial volumetric diamond table—available/worn, wear rate, required weight on tool/torque on tool, tool performance, mechanical specific efficiency, and other mid-level computation results.

210 discloses a part of on-field analysis functionality of the system, and from the performed engineering analysis, computes higher level parameters that help with on-field decision making, guidance, and extend predictive and prescriptive analytics projecting the tool's life span, and insight in to the health and status of the tool.

212 discloses the matter based on the above calculation, which infers and recommends if the drill tool should be replaced or used further within certain set of operating conditions and the expected performance from the tool.

214 discloses a part of analysis to help improve the design and mechanical construction of the drill tool via analysis and drill tool run feedback. It co-relates traditionally measured historical logs of drill tool runs (down hole and at surface) (Drilling Depth/UCS/CCS/WOB/TOB/RPM/ROPNibrations and others) with the current computed health/fault status and engineering analysis of the drill tool; computing, which part of cutting elements have worn or have been deformed at a higher rate than normal.

216 discloses the use of specialized image processing/artificial intelligence to detect faults, degradation and other wear and tear on the drill tool for co-relating with engineering analysis.

218 discloses the analysis and identification areas of shortcoming in the current design of the drill tool by overlaying and co-relating fault/deformation for multiple drill tool runs (Identification of less diamond table volume in particular radial segment, higher forces/wear rate on particular cutting element, impact susceptibility, higher temperature, improved cutter parameters) and others.

220 discloses the recommendation suggestions used to improve and provide for a new Drill bit design based on the historical analysis of the drill tool run and, detected & identified issues/deformation/degradation of the tool. The recommendation includes addition of additional blades/cutters, repositioning cutters, change in type of cutters, increase in diamond table thickness and other parameters based on actual fault and failure analysis. 222 provides a work bench to implement the recommendation as in 220 and automatically modify and generate a 3D CAD model for the drill tool. 224 discloses the improved and enhanced drill tool post feedback analysis.

226, 228 and 230 discloses the parts of analysis performed by the electronic system to further present itself as an intelligent sensor that provides the status, health and information about the faults and deformation, degradation, wear and tear, and possible reasons for the drill tool to degrade, and forwards this information to higher level systems including for data analytics for the overall drilling operation.

Figure 3:
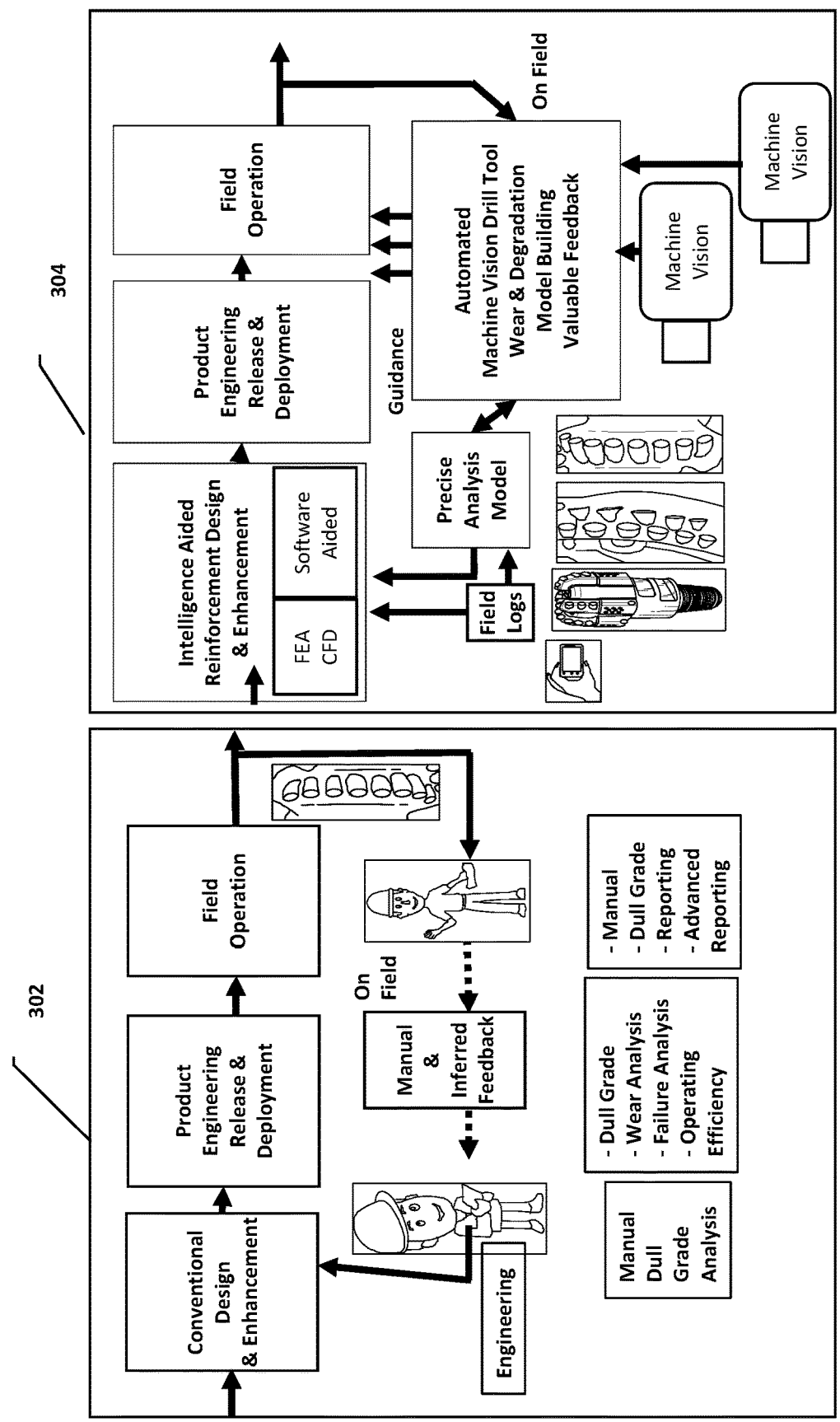
FIG. 3 illustrates the key mechanism and difference between conventional and manual dull grading and the superior advantage of automated analysis along with dull grading.

FIG. 3 illustrates the key mechanism and difference between conventional and manual dull grading and the superior advantage of automated analysis along with dull grading as illustrated in 302 and the superior advantage of automated analysis along with dull grading 304. 302 requires the human intervention to observe and record various degradation, deformation and failure on the drill tool.

This leads to limitation in the analysis and susceptible to human error. 304 is an automated electronic form to analyze and dull grade the drill tool with many benefits as presented in FIG. 1.

Figure 4:
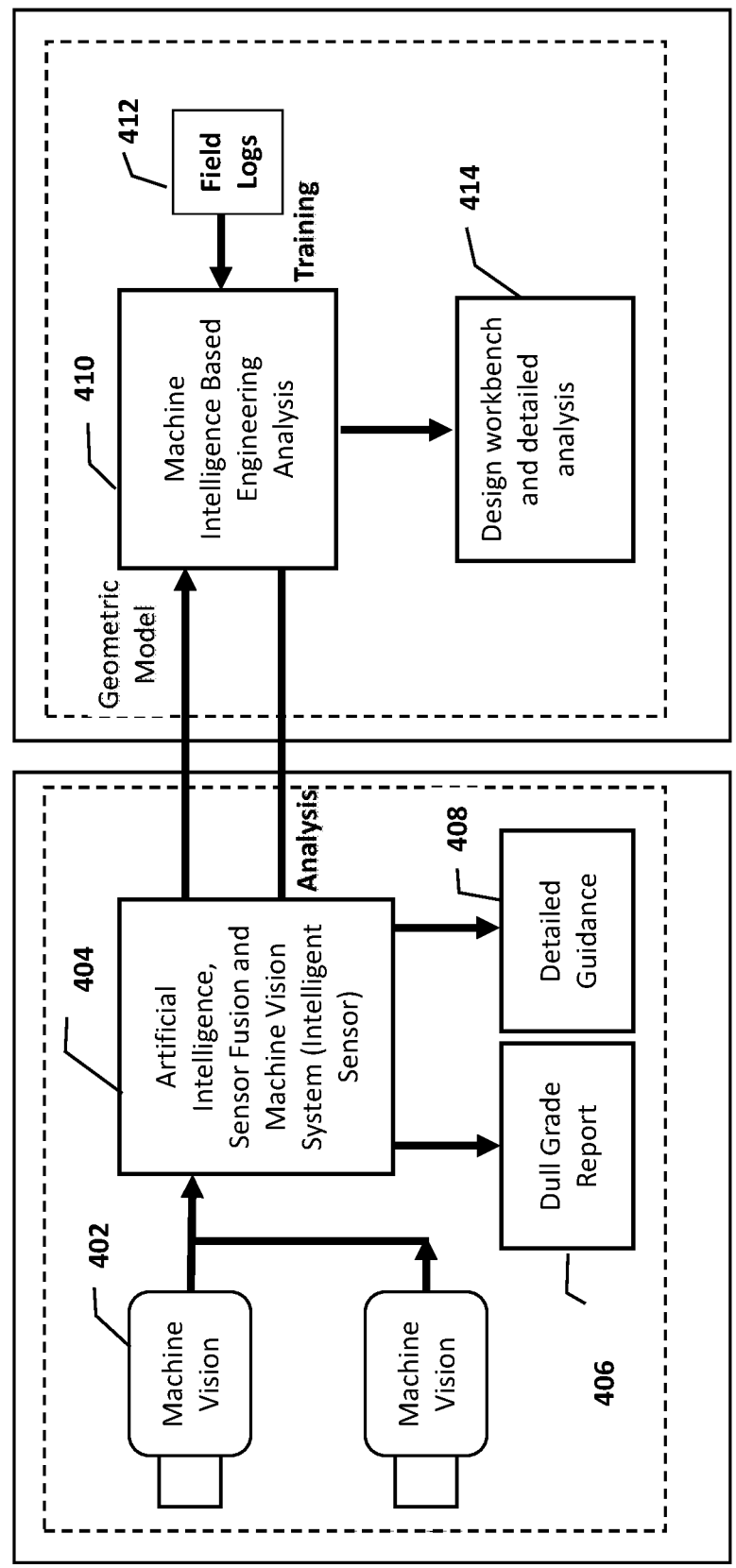
FIG. 4 illustrates the twin internal functionality of the electronic automated drill tool analysis and dull grading system.

FIG. 4 illustrates the twin internal functionality of the electronic automated drill tool analysis and dull grading system. FIG. 4 presents the two major execution blocks of the electronic system. 402, 404, 406 and 408 shows implementation of artificial intelligence to enhance machine vision system for image processing. The enhanced image processing module in collaboration with sensor fusion from position sensors generates a geometric drill tool model with its wear/faults and a dull grade report.

According to FIG. 4, as part of the front-end components the module automatically generates a detailed dull grading report and further providing key guidance to the operator on the current health including preventive and prescriptive status of the tool. 410, 412 and 414 are a part of machine intelligence-based engineering analysis system that implements an analysis and design workbench that accepts geometric model (worn & degraded) of the drill tool. It further performs detailed analysis including calculating segmental volume, forces, DOC-WOB-TOB charts, Life Span and Drilling Efficiency. It also provides a comprehensive workbench to compare design and perform cause effect analysis to improve on the design utilizing field condition of the drill bit automatically.

Figure 5A:
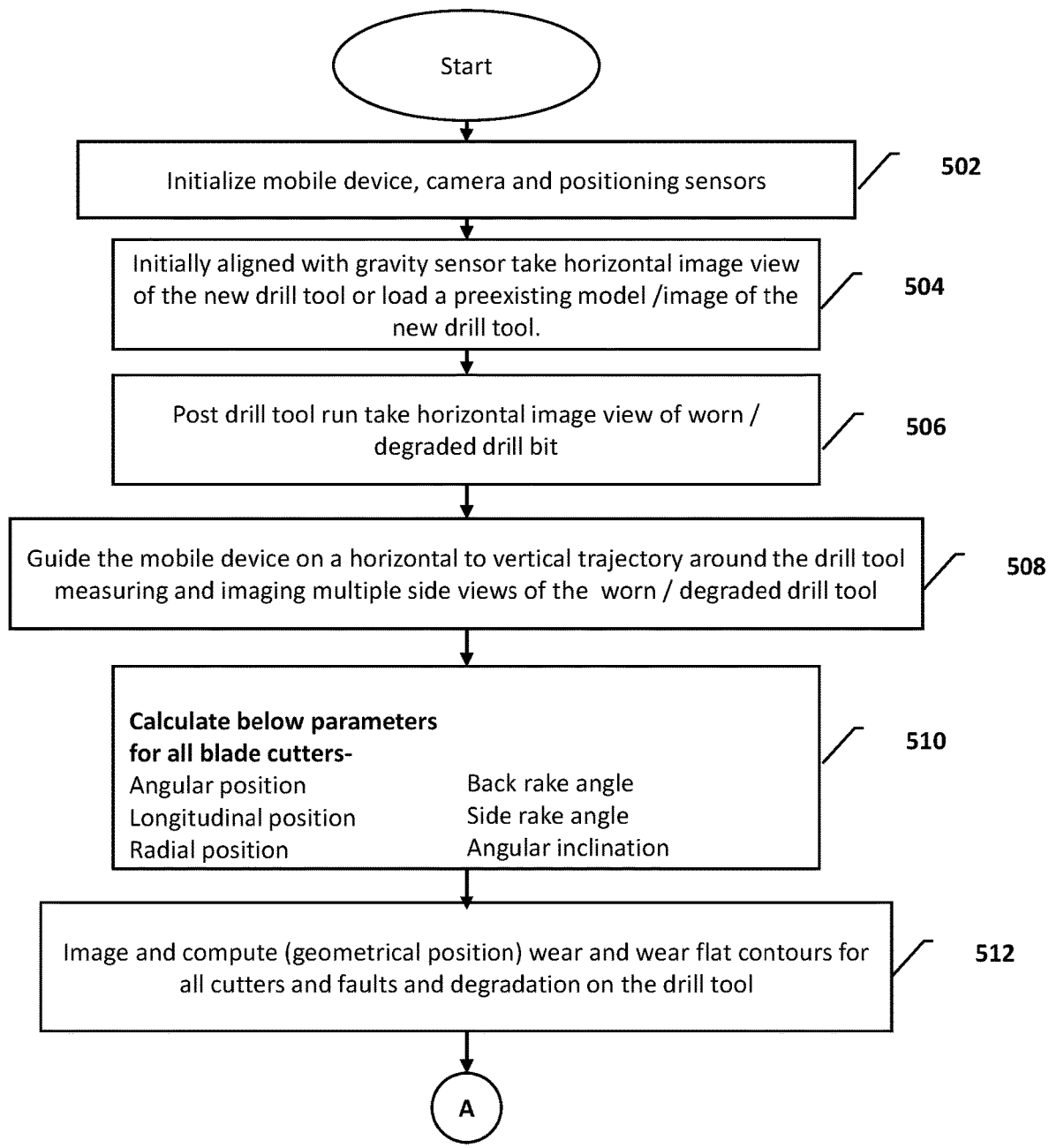
FIG. 5 illustrates a schematic flow chart presenting the steps of the mobile device, acquiring images and position sensor and generating various parameters that are used to detect faults on the drill tool and perform engineering analytics to provide predictive, prescriptive analytics and detailed guidance on the health and future drilling ability of the drill tool.
Figure 5B:
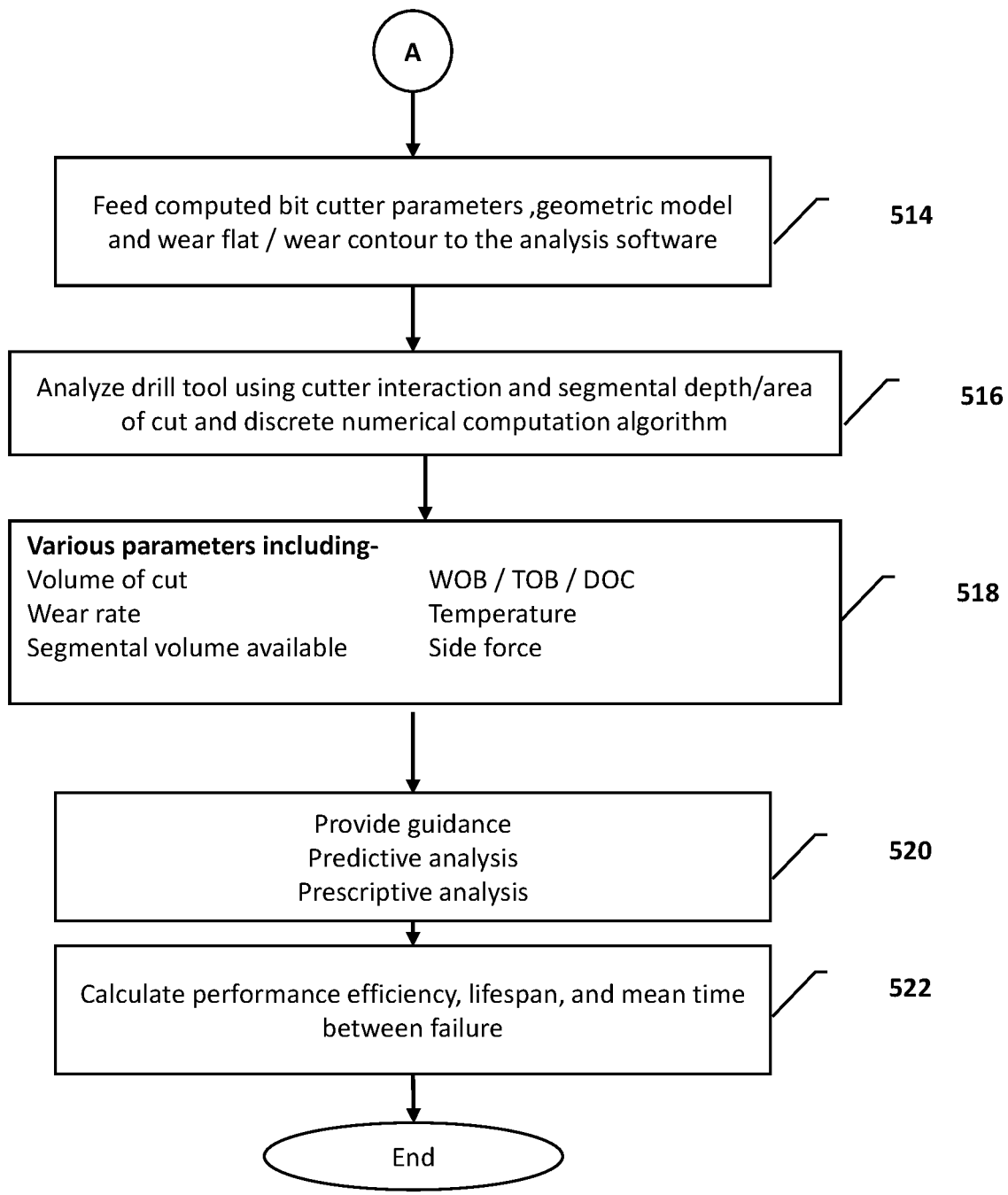

FIG. 5 illustrates a schematic flow chart presenting the steps of the mobile device, acquiring images and position sensor and generating various parameters that are used to detect faults on the drill tool and perform engineering analytics to provide predictive, prescriptive analytics and detailed guidance on the health and future drilling ability of the drill tool. FIG. 5 presents the flow schematic for the analysis and guidance functionality 102 that images and perform a deep analysis of the drill tool performing analytics and providing guidance on performance, efficiency and the current and future drilling ability of the drill tool.

The parts of FIG. 5 discloses the invention where, 502 requires the mobile device to be initialized and the image camera and sensors calibrated for further processing for the device. 504 stipulates that a new drill tool be imaged for use as a reference comparison in particularly to mark-up for the drilling diameter of the tool and compute dimensions later on the analyzed used drill tool. Once the new tool has been imaged its information can be stored in a data base for further reference and matching.

Figure 9:
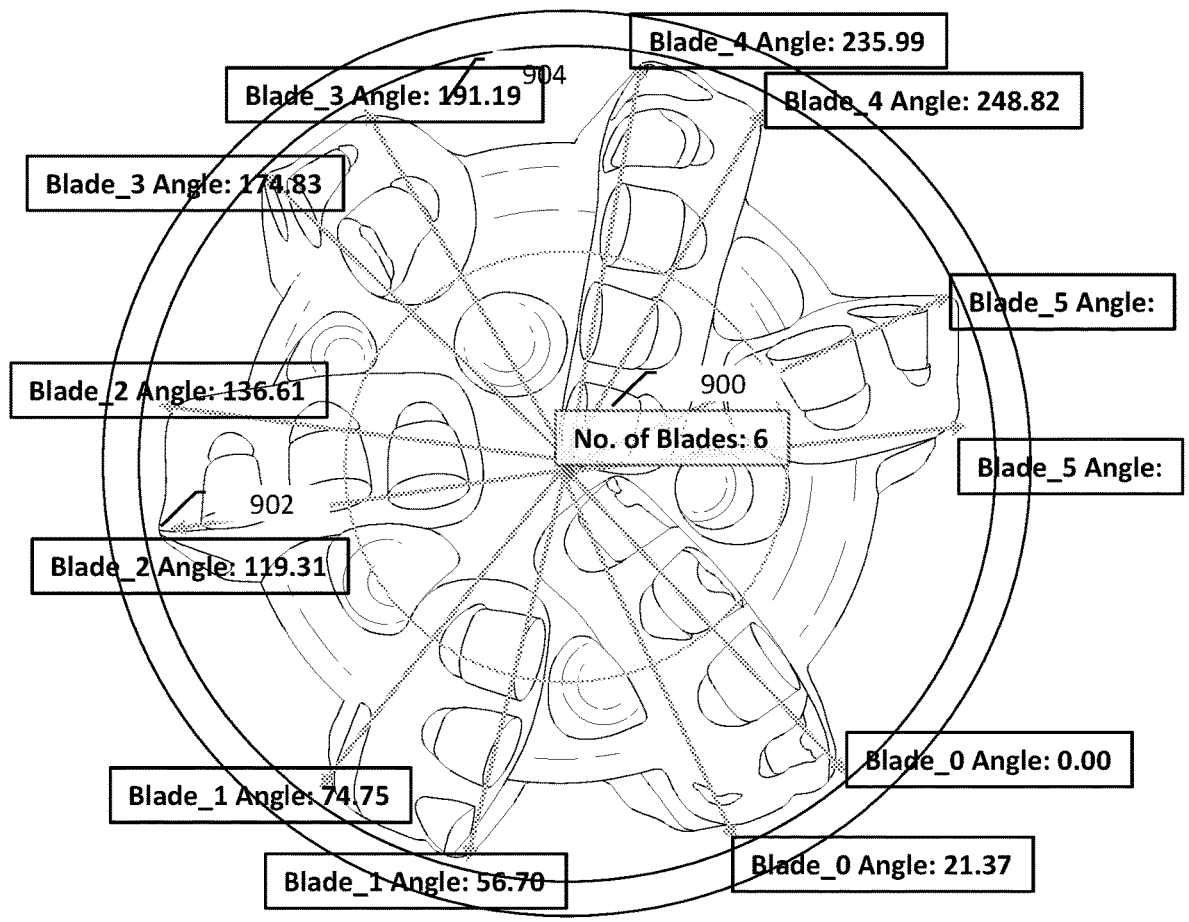

506 discloses the diagram further illustrates that the worn drill tool be first imaged starting from mobile device placed in a horizontal direction, viewing the cutting face of the tool, with gravity sensor assistance to position the tool horizontally and as presented in FIG. 9. Various parameters including shape matching with the original cutter to deduce percentage reduction in each blade outermost edge are computed, determining the wear percentage on the outer most cutters and reduction in the drilling diameter of the tool.

508 discloses the measured and guided traverse of the system from a horizontal top face view to a side blade facing view. The mobile device continuously records its position and captures multiple images of the side facing blade as is guided around the drill tool. This helps to discover and compute geometric position and wear contours/area of all the cutter (cutting element) on the blade and the bit with respect to a computed origin usually the pin center in the case the drill tool is a PDC drill bit.

510 discloses the various absolute geometric parameters that are computed in the case of a PDC cutters. 512 discloses the computation of wear contour and the wear flat area contour for each cutter in absolute coordinates in a bit co-ordinate system that is further used to compute cutter face and wear flat area participating in the cutting interactively. 514 and 516 discloses the above computed wear flat contour and area geometric coordinates are further input to an engineering analysis algorithm that uses segmentation, discretization and interaction of each cutter wear face and wear flat to translate cutting face area to cutter forces.

518 discloses the computation of various engineering parameter for the drill tool computed from the various cutter forces including:
Segmental Available and worn diamond table volume;
Volume of cut;
Wear rate;
Bit/Blade Forces;
Segmental volume available;
Required WOB/TOB/DOC graphs;
Temperature;
Side forces;
Bending Moment;
Projected Life Span of Drill Tool; and
Mechanical Specific Efficiency According to the FIG. 5, the 520 and 522 discloses the computation of higher-level guidance and analysis from the computed parameters including life span, predictive analysis, prescriptive analysis, mean time between failure and decision making.

Figure 6:
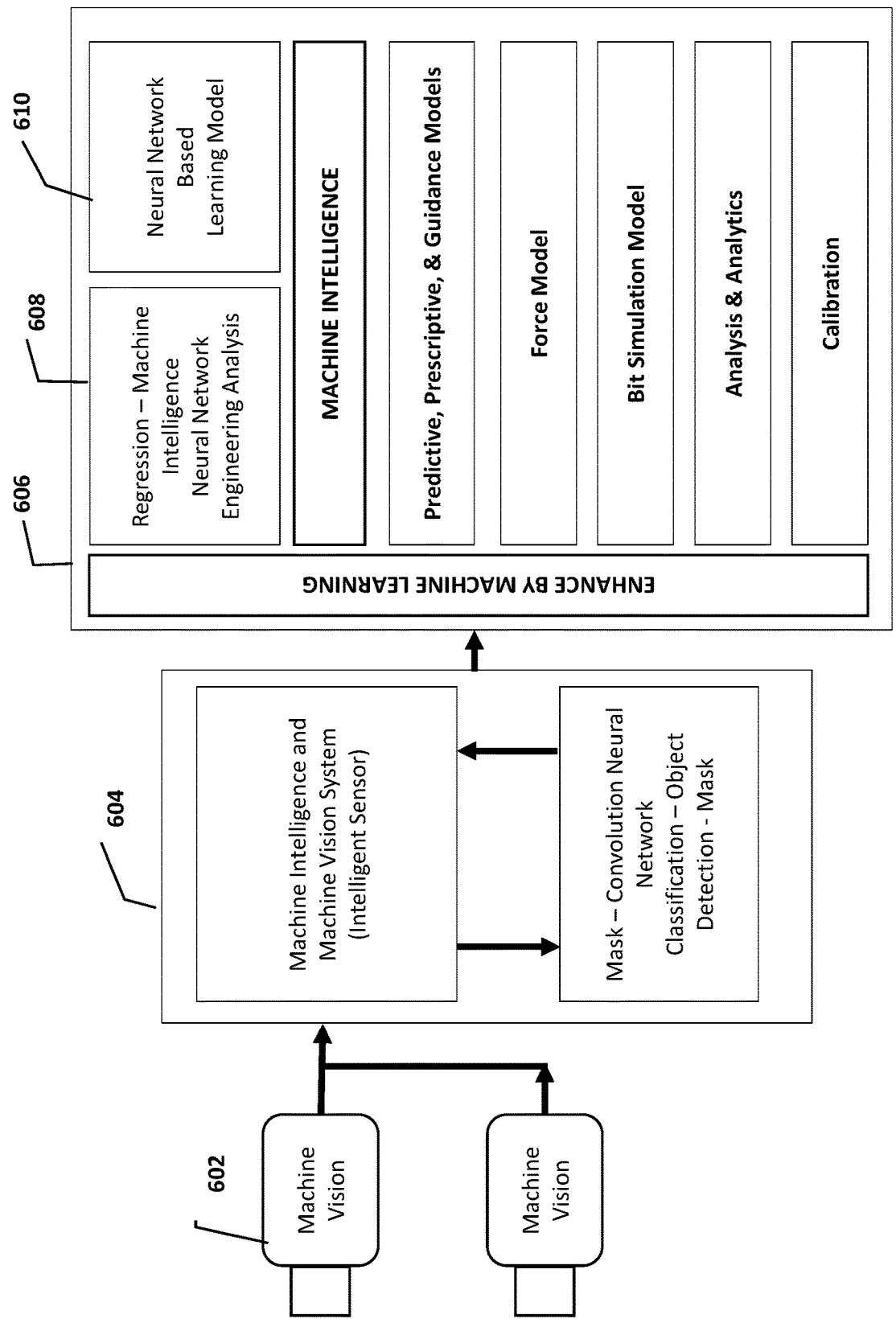
FIG. 6 illustrates the functional block diagram showing coupling of artificial intelligence and neural network-based machine vision used for the automated dull grading and analysis system.

FIG. 6 illustrates the functional block diagram showing coupling of artificial intelligence and neural network-based machine vision used for the automated dull grading and analysis system. Referring to FIG. 6, the artificial intelligence and neural network-based machine vision as applied to the electronic system for better drill tool visualization, object recognition and detecting and profiling faults and wear and further to address self-learning nonlinear bit formation cutting dynamics from historical log data and visual foot print of the drill tool.

The system can visualize the drill tool on the field or in a test setup using its high-resolution cameras guided around the drill tool in a controlled, sensed, measured and pre-programmed trajectory to detect various deformation, faults, and wear and tear on the tool, while profiling and generating a geometric model of the components of the drill tool.

According to FIG. 6, 602 discloses the multiple cameras acquiring images of the drill tool and further send to 604, which is a neural network enhanced image processing module for object classification and image segmentation to identify the various objects and conditions of the drill tool. 606 discloses an overall block diagram presenting the coupling of neural network based algorithms for deformed drill tool analysis along with engineering analysis to provide predictive, prescriptive guidance, force models, bit simulation model, analysis results and field calibration. 608 and 610 discloses a regression neural network model to train and predict the cutter force interaction model for degraded drill tool and its cutting elements (as sensed).

Figure 7:
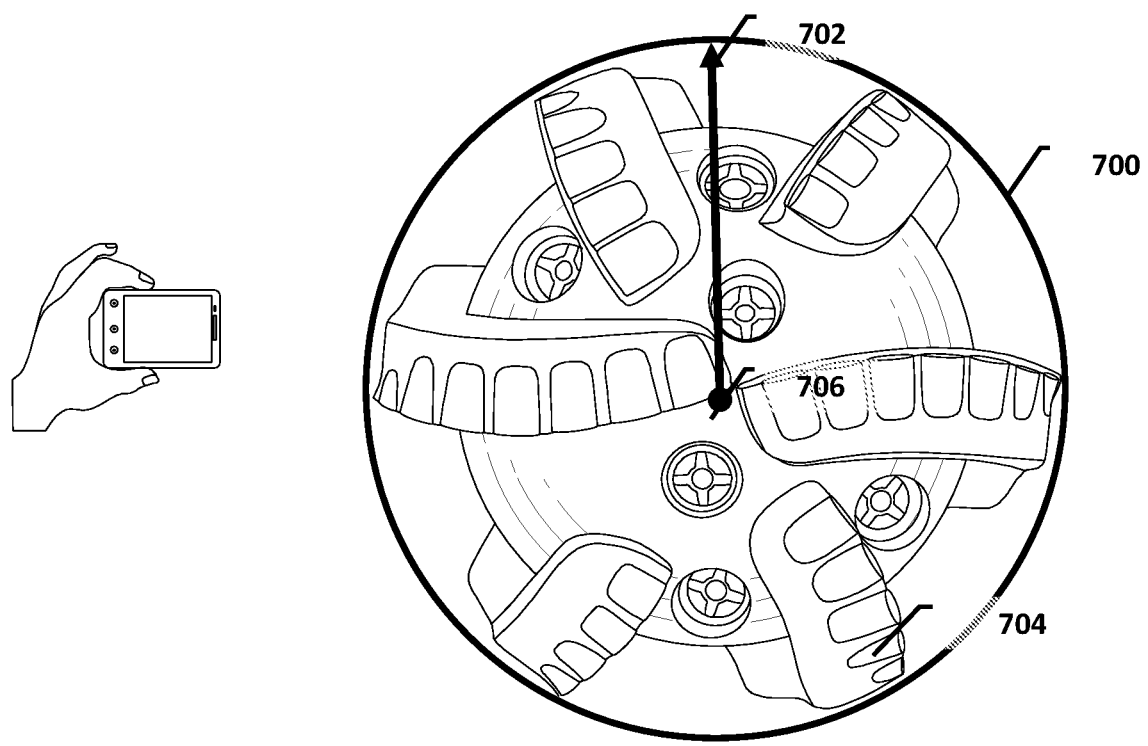
FIG. 7 illustrates the top or face view of a drill tool with an image processed and computed enclosing circle bounding the outermost cutting edge of the drill tool along with its edge external contour.

FIG. 7 illustrates the top or face view of a drill tool with an image processed and computed enclosing circle bounding the outermost cutting edge of the drill tool along with its edge external contour. Reference is now made to FIG. 7 which presents a captured and processed top view or tool front facing image of the new drill bit, that has been imaged and captured by the system and has multiple blades with cutters. The drill bit front face or top view image has been matched using artificial intelligence to recognize the make and size of the drill bit in particularly its cutting diameter.

According to FIG. 7, 700 discloses an enclosing circle computed and processed from the image that encloses the outermost edges of the shoulder or outer cutter edges of each blade and represents the diameter of the circle and further also represents the cutting diameter of the drill bit or drill tool. 702 represents the computed radius from the center of the circle (tool face center) to the enclosing circle. 704 discloses the detected external contour of the drill tool that bounds the drill tool and is used to calculate various moments and parameters of the image. 706 discloses the center of the enclosing circle with 702 representing a radius from the center of the circle to its circumference.

Figure 8:
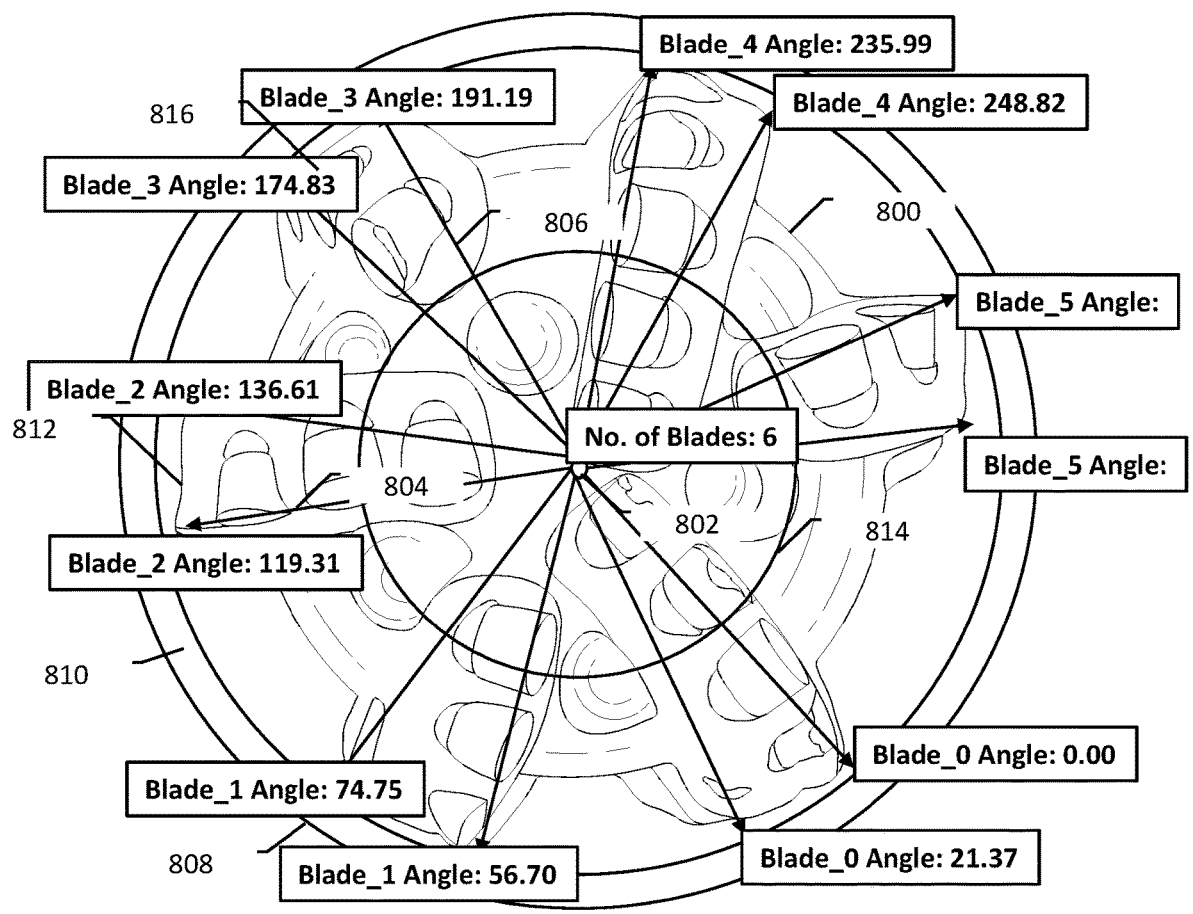
FIG. 8 and FIG. 9 illustrates an image processed view of the front facing or top view of a worn/degraded drill tool where important parameters including centroid of the image, original image enclosing circle (scaled and overlaid), current worn cutter enclosing circle, centroid and differential wear reduction in outermost drill tool cutting edge are depicted.

FIG. 8 and FIG. 9 illustrates an image processed view of the front facing or top view of a worn/degraded drill tool where important parameters including centroid of the image, original image enclosing circle (scaled and overlaid), current worn cutter enclosing circle, centroid and differential wear reduction in outermost drill tool cutting edge are depicted. FIG. 8 presents the top or cutting face view, i.e. captured and processed image of a used/Worn/degraded drill bit. The image is processed matched and compared with the top face view of the original new image and its bounding circle. The earlier computed bounding circle of the new drill bit is match scaled and overlaid on the newly captured image of the worn drill tool.

According to FIG. 8, 800 shows a computed external counter that bounds the outermost edges of the drill tool removing any background or occluding objects. 802 represents a computed original image, external counter image centroid. 804 and 806 represents lines computed from centroid of the (image tool) to outermost point for each blade (leading and lagging edges). The lines also extend the start and end angle for each blade with associated angular position computed relative to an arbitrary radial axis. 200 shows the matched scale and overlaid circle of the original new drill bit image on the processed image of the worn drill bit.

Referring to FIG. 8, 810 shows the difference in radius between the radius representing the new drill bit cutting radius 208 and the worn drill bit outermost cutter cutting edge for a blade the difference in radius represents the reduction in cutting radius of the tool for the given blade and the percentage difference in radius represents the wear percentage of the shoulder cutter for each blade, and the radius and external outermost point of each blade is persisted for further processing.

812 represents an enclosing circle for the outermost cutting edge for the worn drill bit and is useful to compare with the original drill bit circle to examine wear and reduction in cutting radius and in the case of broken/chipped/delaminated shoulder cutters. 814 represents the inner circumference for the drill bit enclosing the inner cutters for the drill tool.

FIG. 9 illustrates the top view of the drill tool or cutting face view, i.e. captured and processed image of a used/Worn/degraded drill bit. The image is processed matched and compared with the top face view of the original new image and its bounding circle. The earlier computed bounding circle of the new drill bit is match scaled and overlaid on the newly captured image of the worn drill tool. The figure additionally presents the detected number of blades 902, the blade leading angle for each blade 904 and the blade lagging angle for each blade 906.

Figure 10:
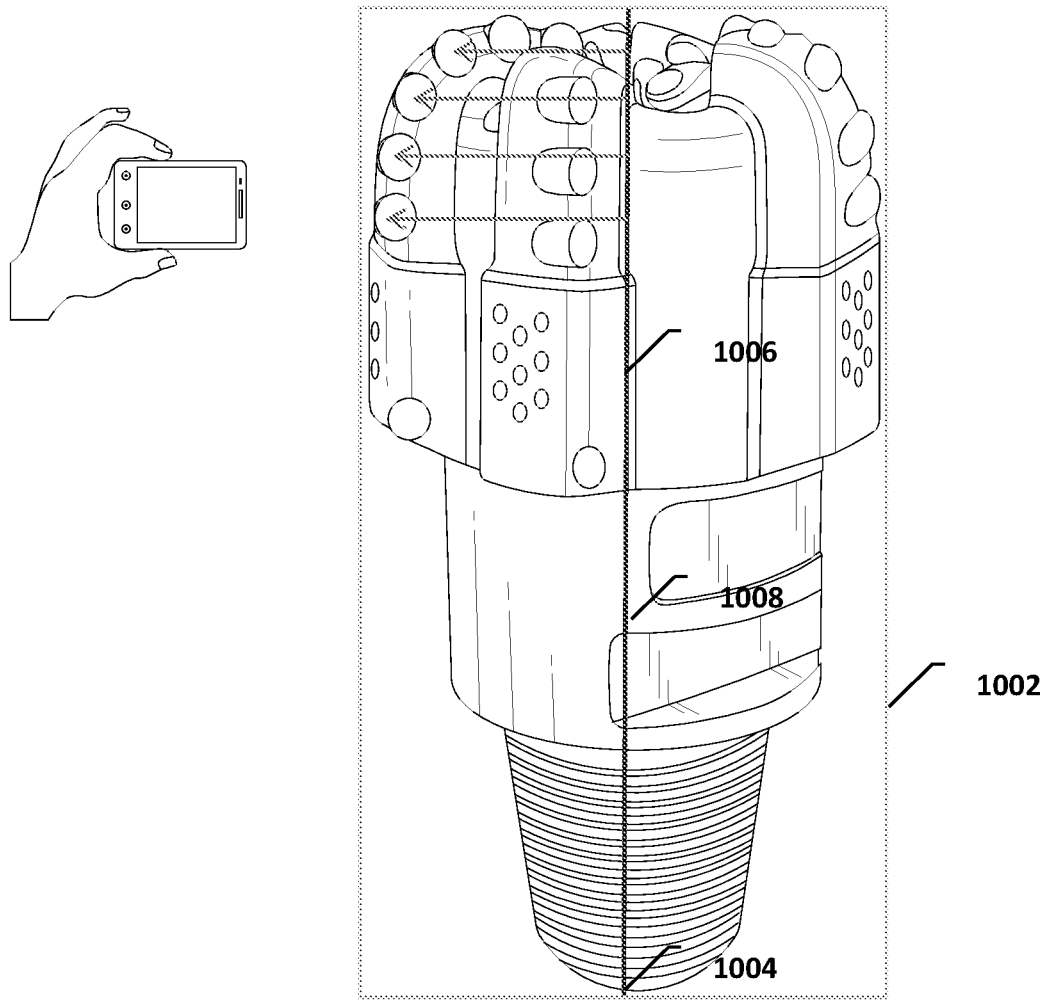
FIG. 10 illustrates an image processed and overlaid image of the side facing view of a worn/degraded drill tool where important parameters including, Bit Origin (Bit Pin Centre), Longitudinal axis parallel to gravitational axis, processed and detected worn cutters, their wear contours, detected wear flat contour are presented
Figure 11:
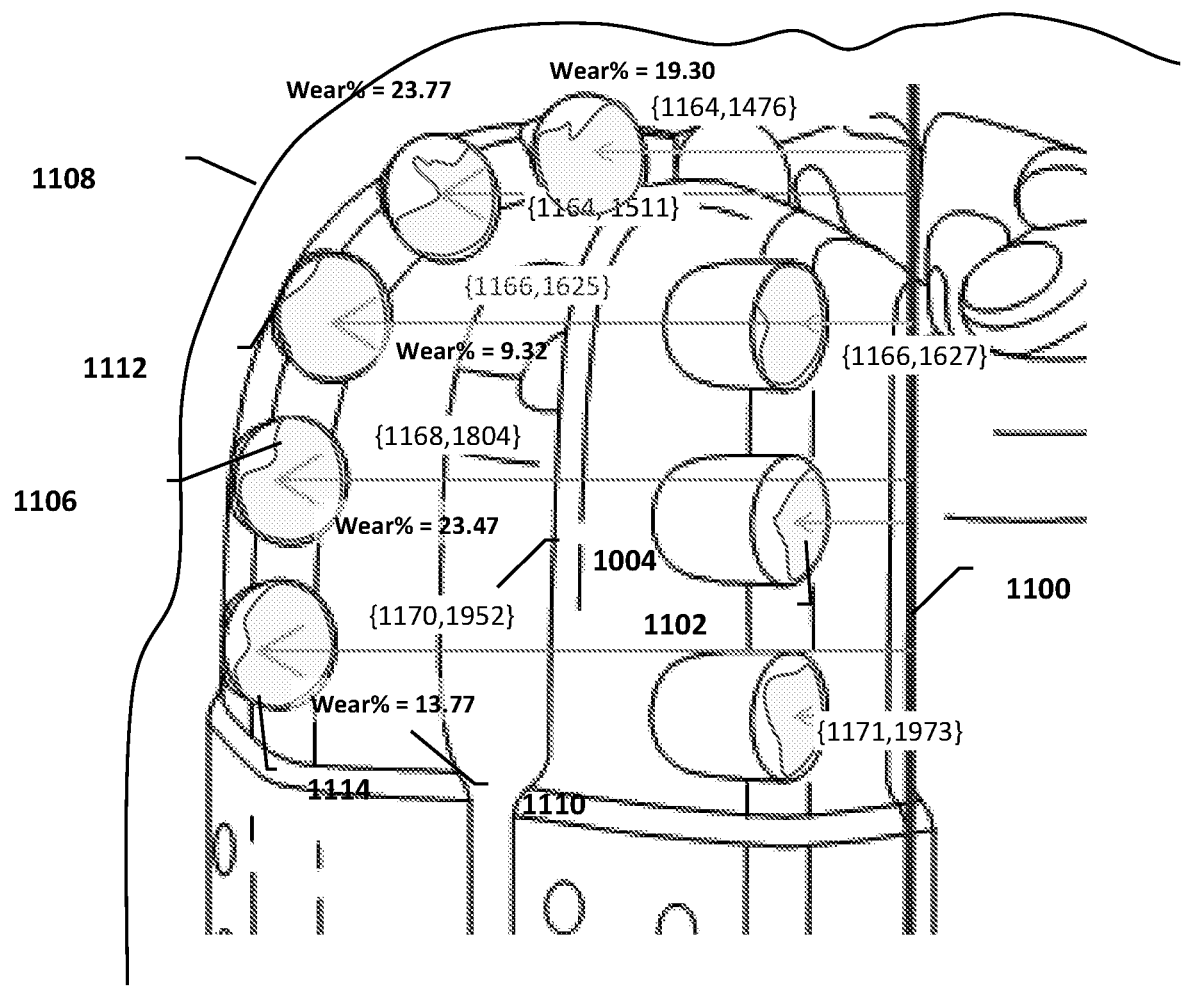
FIG. 11 illustrates a zoomed view of the image processed side facing view a worn/degraded drill tool where important parameters including, Longitudinal axis parallel to gravitational axis, processed and detected worn cutters, their wear contours, detected wear flat contour are presented

FIG. 10 and FIG. 11 shows the captured and image processing image of a used worn drill bit blade, where the camera has travelled from top view (horizontal orientation of camera) to side view (vertical orientation of camera) of the drill tool and given blade with the particular position of the camera computed and traced.

FIG. 10 illustrates an image processed and overlaid image of the side facing view of a worn/degraded drill tool where important parameters including, Bit Origin (Bit Pin Centre), Longitudinal axis parallel to gravitational axis, processed and detected worn cutters, their wear contours, detected wear flat contour are presented.

FIG. 10 discloses the mobile device imaging the drill tool in a side view to compute positions of various cutting element and other components of the drill tool. It further illustrates in detail an image processed side facing view of a worn/degraded drill tool where important parameters including, longitudinal axis parallel to gravitational axis, processed and detected worn cutters, their wear contours, detected wear flat contour are presented. Referring to FIG. 10, a side view of a drill tool blade is disclosed where 1002 discloses a bounding box detected by image processing and bounds the drill tool. 1004 detected and computed tool origin used as reference for distances of all objects in the image. 1006 discloses the image centroid of the drill tool. 1008 discloses the longitudinal axis of the drill tool detected by image processing and gravitational sensor alignment.

Referring to FIG. 11, 1100 discloses a section of longitudinal Axis with the bit center at the drill bit pin center. 1102 represents a worn and broken cutter image in its not processed form. 1104 represents a computed and traced line, perpendicular to the longitudinal axis of the tool and terminating at center of each detected cutter for the blade in view. The two positions radial position from the from Cutter Centre to tool longitudinal axis, and longitudinal position—distance from tool center (origin) to perpendicular intersection are in terms of the image perspective (angles and scale) and need mathematical correction to translate to actual radial and longitudinal position for the cutter.

Referring to FIG. 11, 1106 represents a wear counter of a worn cutter detected and computed by image processing, isolating the counter in terms of circularity, ellipticity, area, location and further processing by artificial intelligence, such as mask-Region of Interest Convolution Neural Network or another algorithm. The wear contour is located in terms of image coordinates for further processing. 1108 discloses an external computer contour for the blade bit/used to remove background objects appearing in the image. 1110 discloses a calculated wear percentage of the cutter as a fraction of the area enclosed by the detected wear counter to the original face area of the cutter and 1112 discloses the representative circle bounding the cutter with area equivalent to the wear cutter face.

The computation of cutting element geometric parameters includes: the absolute position of each object (cutter position, wear contour, wear flat contour) in the image is computed in reference to previously computed outer most cutting edge of each blade 1114 (804) in reference to a tool center and a tool longitudinal axis that is used as an reference in further side view to compute absolute radial and longitudinal position for each object (cutting element and others) in the image and further refining with calculation aid from sensor position acquired.

Figure 12:
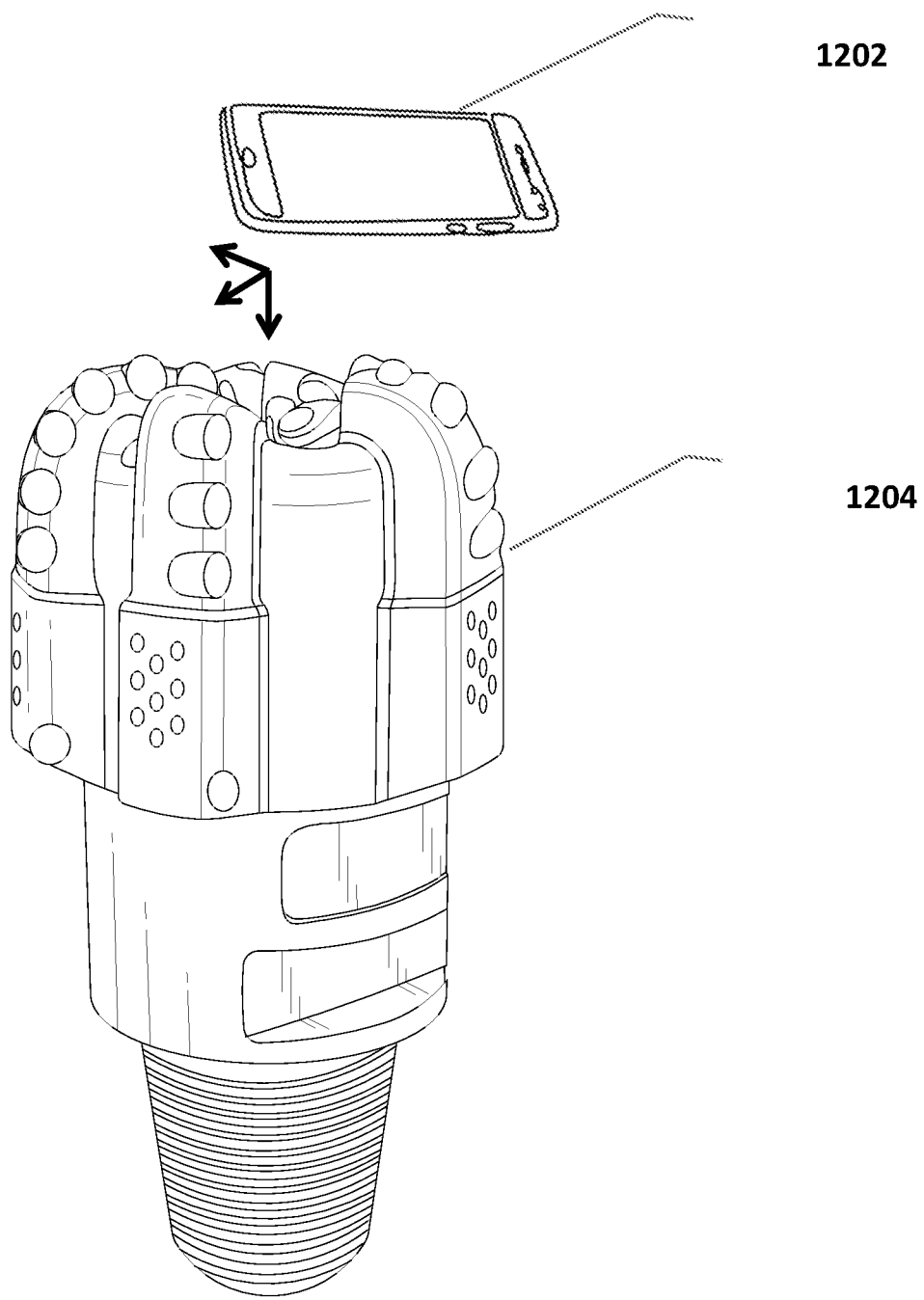
FIG. 12 illustrates a mobile device integrated with a high resolution image camera, a video camera and MEMS and other inertial/position sensors, imaging the drill tool in a horizontal position to capture tool front face (top view)

FIG. 12 illustrates a mobile device integrated with a high-resolution image camera, a video camera and MEMS and other inertial/position sensors, imaging the drill tool in a horizontal position to capture tool front face (top view). FIG. 12 discloses the mobile device 1202 in a horizontal position to image and the drill tool 1204 in a top (front facing) view. In this position the mobile device initializes it sensors and computes multiple information for the drill tool top view image as presented in FIG. 7.

Figure 13:
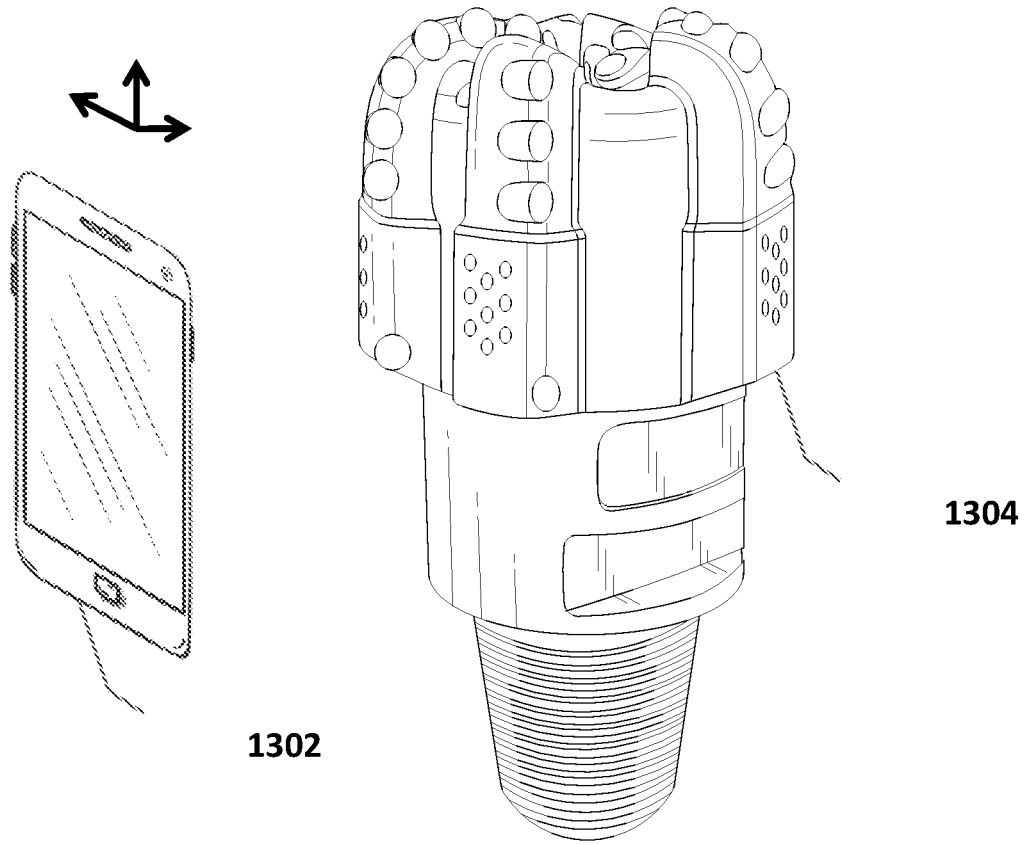
FIG. 13 illustrates a mobile device integrated with a high-resolution image camera, a video camera and MEMS and other inertial/position sensors, imaging the drill tool in a vertical (side) position to capture tool side view

FIG. 13 illustrates a mobile device integrated with a high-resolution image camera, a video camera and MEMS and other inertial/position sensors, imaging the drill tool in a vertical (side) position to capture tool side view. FIG. 13 discloses the mobile device 1302 in a horizontal position to image and the drill tool 1304 in a Side (Blade facing) view. In this position the mobile device uses its sensor information and Image Processing to compute geometrical information about the blade and its cutting element and build wear contour and wear flat contour.

Figure 14:
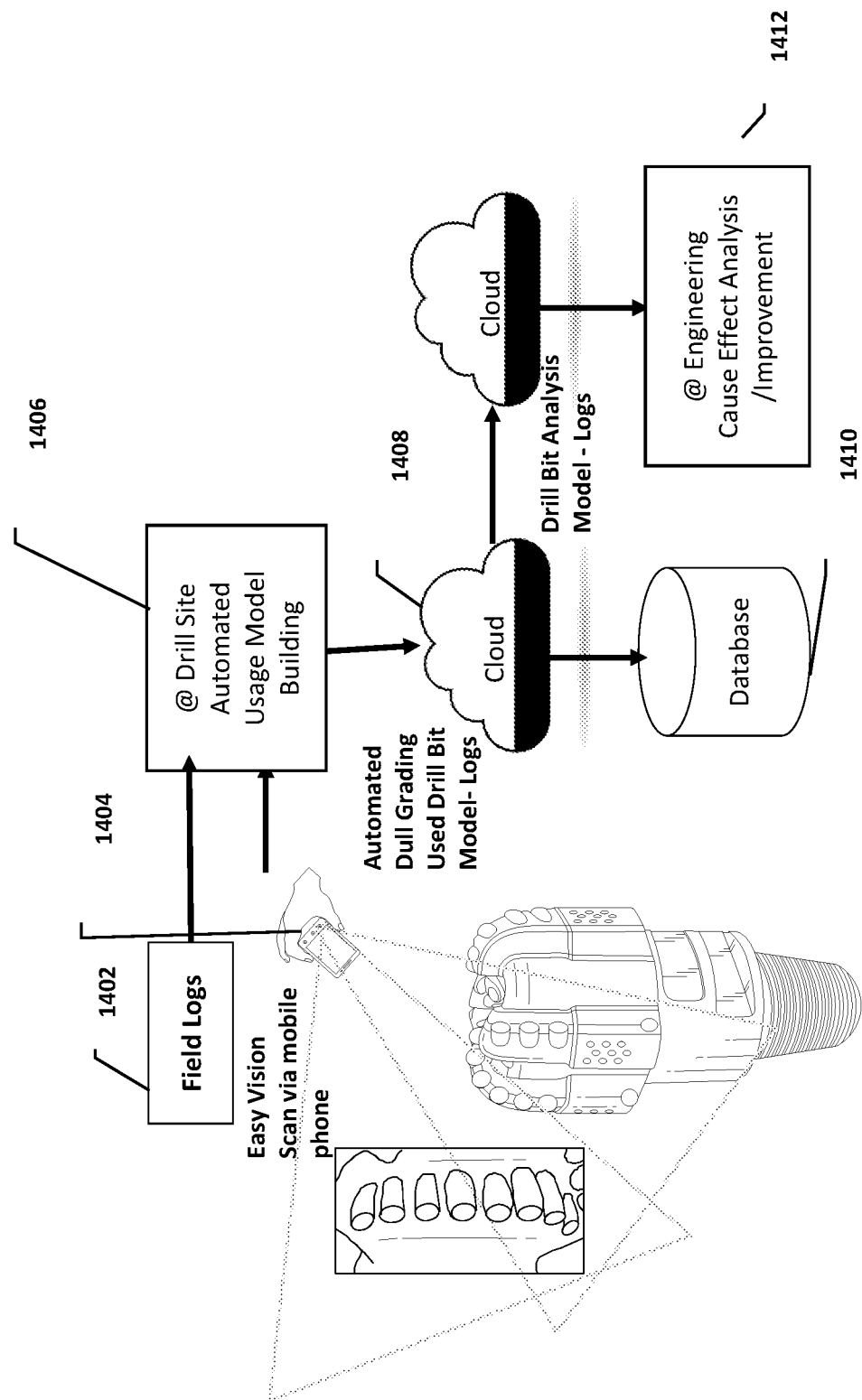
FIG. 14 illustrates the usage of cloud computing to save or persist important drill tool deduced and computed information to a repository as available for later tool analysis, reference and improvement.

FIG. 14 illustrates the usage of cloud computing to save or persist important drill tool deduced and computed information to a repository as available for later tool analysis, reference and improvement. The component 1402 depicts acquired fields logs while drilling; 1404 discloses the image processed and processed scan information of the drill tool that is acquired by 1406 and further transmitted to the cloud 1408 and persisted in a database 1410. This information can later be fetched for further engineering analysis by 1412.

Figure 15:
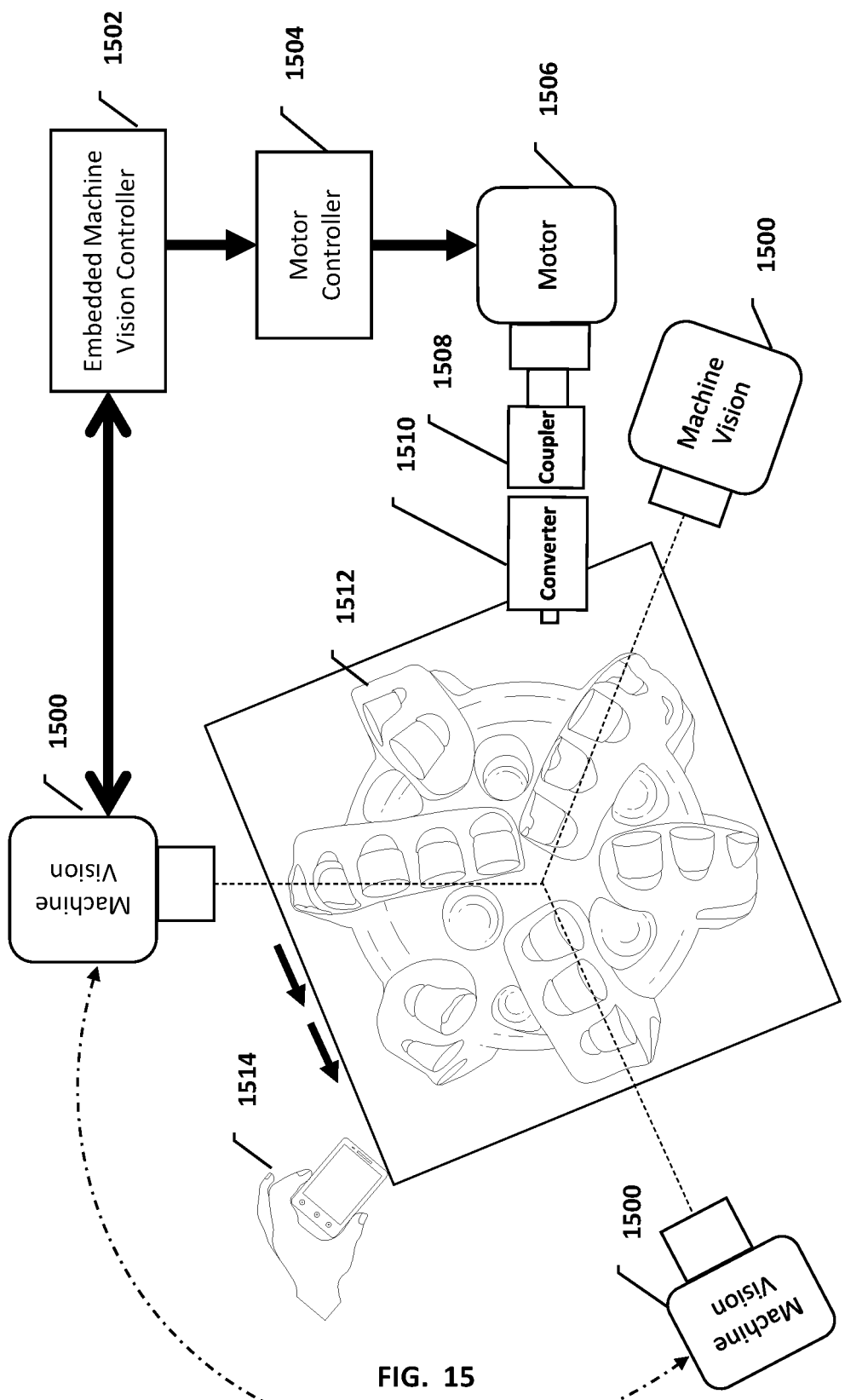
FIG. 15 illustrates a fixed setup with multiple camera that uses a motorized system to control the orientation of the drill tool without a need to manually scan the drill tool

FIG. 15 illustrates a fixed setup with multiple camera that uses a motorized system to control the orientation of the drill tool without a need to manually scan the drill tool. FIG. 15 discloses a block diagram of the embodiment depicting the various blocks used in a test jig to profile the state of the drill tool (wear and degradation) using at least one or more high speed, high resolution camera that are controlled by a machine vision controller which also precisely controls the rotation of the drill tool to enable to accurately capture the geometric and worn part of the drill tool. The embedded machine vision controller 1502 is in connection with the electronic machine vision system 200, which is also connected to the motor controller 1504. The motor controller 1504 controls the motor 1506, which is connected to the electronic machine vision system with the drilling tool 1512, through the coupler 1508 and the converter 1510.

Figure 16:
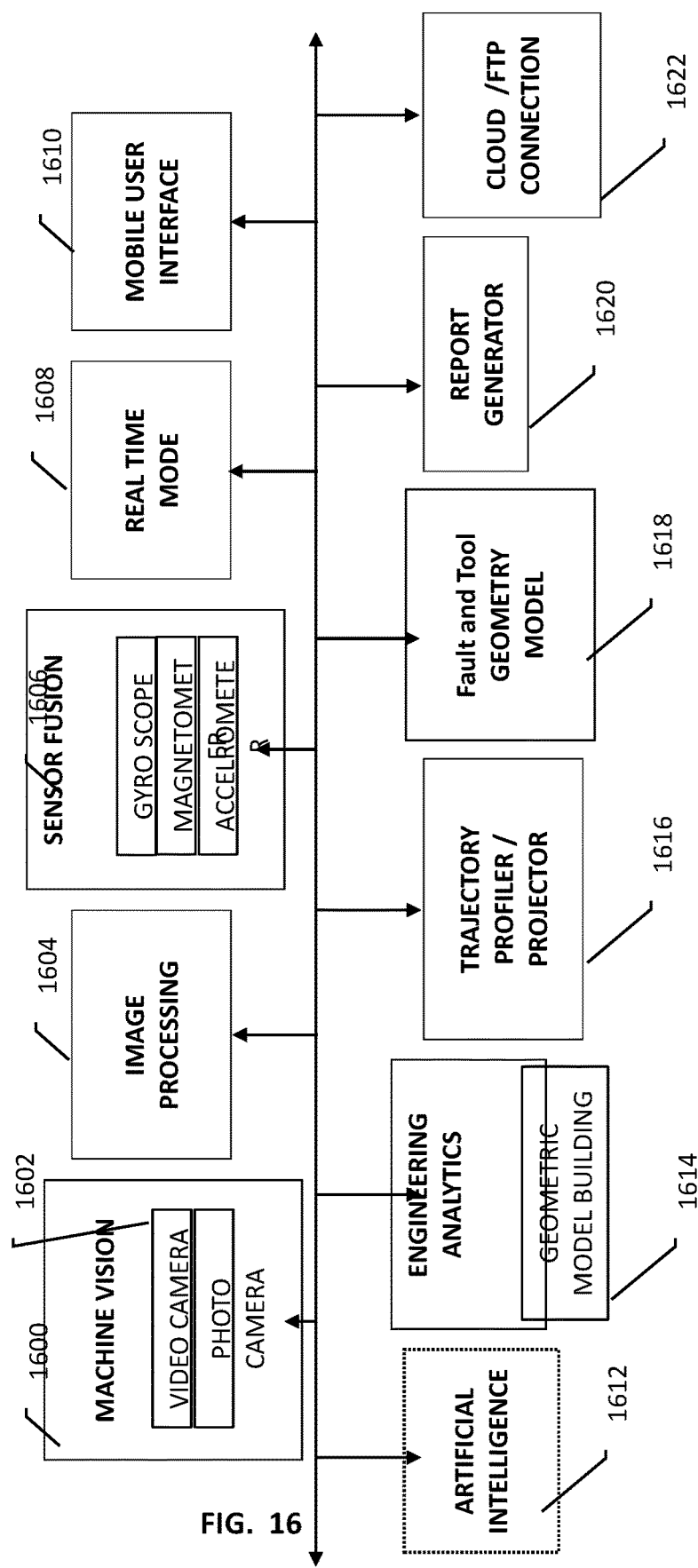
FIG. 16 depicts the various functional block diagram of the electronic system that uses a combination of image processing, sensor fusion and artificial intelligence to visualize and compute information on the drill tool.

FIG. 16 depicts the various functional block diagram of the electronic system that uses a combination of Image Processing, Sensor Fusion and Artificial Intelligence to visualize and compute information on the drill tool. FIG. 16 discloses a block diagram of the embodiment depicting the various functional block used in the electronic system (mobile device). Referring to FIG. 16, 1600 and 1602 is used to interface and control the operation of a video and photo mode camera including using a flash device to illuminate the drill tool and focus and operate its camera optimally.

The component 1604 discloses the Image Processing functional block used to process various information from the captures image including edges, shapes, contours, background reduction, filters, hull detection and others. 1606 discloses the sensor fusion functional block diagram that interfaces to the sensors in the mobile device including gyroscope, orientation, magnetometer, accelerometer and other sensors. 1608 discloses the functional block that enables real time computation in the device including using GPU if available.

The component 1610 represents a functional block representing the user interface for the device (system). 1612 represents a functional block depicting the use of artificial intelligence to enhance the image processing capability of the system to highlight and recognize the various features, faults, cutting elements, components on the drill tool by learning various filters for objects, shapes, and contour detection in the image under varying conditions. 1614 represents a functional block depicting calculations performed for engineering analytics to compute various engineering parameters of the drill tool using its wear contour and wear flat area contour.

According to FIG. 16, 1616 discloses a functional block diagram depicting a fusion of sensor position information with image processing to calculate and track the trajectory of the electronic system around the drill tool to accurately correlate and compute the position of various components and faults on the drill too, and 1618 depicts the functional block generating a geometric model of the drill tool and its components and faults. 1620 depicts a functional block used to generate a detailed dull grading and analysis report and 1622 depicts a functional block that is used to transmit the generated dull grade and analysis information to cloud-based repository for further use.

Additionally, the electronic system presented in the present invention can either be a customized electronic device, a smartphone device or a mobile device, with at the minimum having high resolution imaging capability and a combination of sensors i.e. accelerometer, gyroscope and magnetometer and have been used interchangeably.

Figure 17:
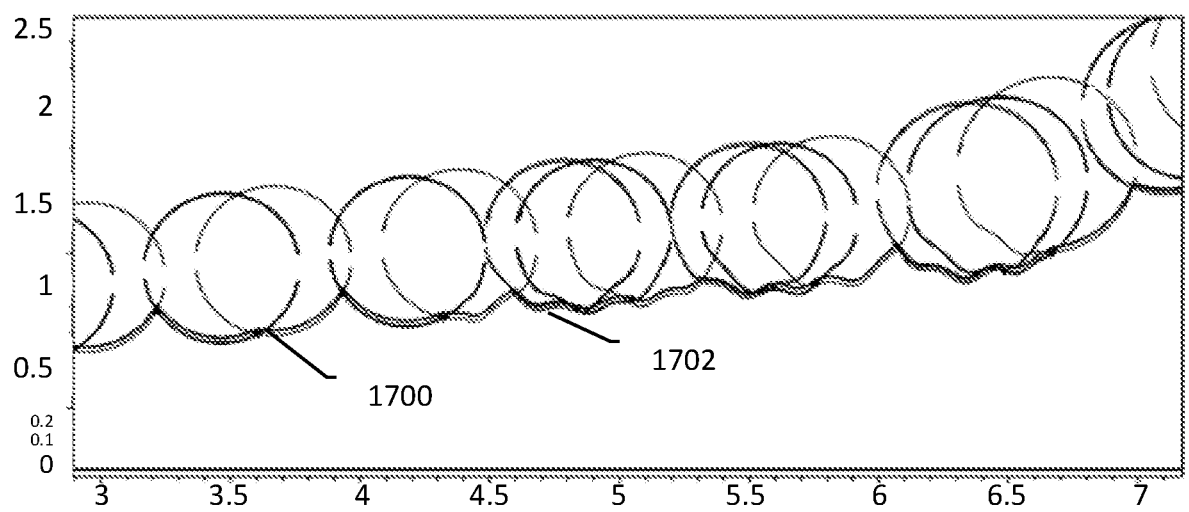
FIG. 17 depicts the interaction plot of the various cutting elements and its wear profile processed by the electronic system used to further compute various engineering parameters.

FIG. 17 depicts the interaction plot of the various cutting element and its wear profile processed by the electronic system used to further compute various engineering parameters. The component 1700 depicts a profile of the interaction plot for cutting element (e.g. PDC cutters) that are intact and not worn; and 1702 depicts a profile of the interaction plot for the cutting element that have worn, presenting a worn cutting face and a wear flat. The imaged and processed, profile and irregular contour is used to compute the radial-segmental interaction of the cutting element with the formation to compute from its cutting face area and wear flat area various engineering parameters including depth/area of cut, volume of cut, various penetrating, drag, radial and longitudinal forces required by the cutters and other engineering parameters.

BENEFITS OF THE INVENTION

1. The analytics engine outputs a host of reports including:
   a. Current Wear Profile—(Wear Flats-Wear Volume-Wear Contours) (Identify problematic areas)
   b. Volumetric Wear
   c. Segmental Wear rates and Volume (diamond table available & Worn)
   d. DOC-WOB-TOB curves (Escalated WOB-TOB estimate due to cutter wear/degradation)
   e. Side Forces Penetrating & Drag Forces
   f. Usable Drill Bit Life ahead
   g. Mechanical Specific Energy/Efficiency of the drill bit
   h. Cost (escalation) per foot drilled
   i. A summary and guidance on the issues related to further using the drill bit
   j. It also generates a detailed dull grade report for the drill bit automatically 2. From a manufacturing perspective, the present invention closes an important gap by automatically capturing and transferring critical on-field information (degradation, wear, faults) in a digital form to the engineering design table (and an inbuilt software design work bench) for analysis, refurbishment and significant improvement of the drill tool.

According to the present invention, the present invention is designed in a manner that it is valuable, and of good use to a varied User Segment, including:
   a. For Drilling Operator/Rig Operator: A unique innovative solution to analyze drill bits and tools mid-way of a drilling session obtaining valuable guidance on the current and future Drilling ability and issues with the drill bit
   b. For Drill Bit Manufacturer: Adds key ability to obtain automated feedback from the field, and incrementally keep improving on the bit design and provide key guidance to drilling operator without manual intervention. (Also improves on customized designs)

c. For Drill Bit Refurbishment/Repair: Automated diagnosis of drill bit helping to decide on the health of the drill bit, the estimated drop in performance and guidance to steer to repair the drill bit.

d. Drilling Analytics/Producer: Acting as an intelligent sensor for drill bit analysis, the software provides key and critical information to data analytics algorithms to improve on their analytics efficiency significantly

I claim:

1. An electronic system for imaging and analyzing various types of formation drilling tools on the field or in a test setup, comprising:
   a. a set of high-resolution imaging cameras for imaging various components of the formation drilling tool;
   b. sensors to profile and compute linear and angular position of the system and the various cutting elements and other supporting components of the formation drilling tool;
   c. software applications with image processing, artificial intelligence, and engineering analytics facility;
   wherein the electronic system is a customized handheld standalone device or a smart phone handheld standalone device with high resolution imaging capability, the electronic system is used to capture high-resolution images when a drilling tool is visually available and pulled out and the sensors are used to further profile and capture positional data of the various components of the drilling tool and the software application is used to process the captured high-resolution images and further perform analysis.

2. The electronic system as claimed in claim 1 wherein, the system can deep scan and analyze a partially or used formation drilling tool on the field or in a test setup; to perform detailed dull grading and engineering analysis; providing usability and guidance on the current and future usability of the drilling tool including for directional drilling operation.

3. The electronic system as claimed in claim 1 wherein, the system can deep scan and analyze a partially or used formation drilling tool; to analyze and identify vulnerable and problematic areas on the tool and to provide recommendations and help re-engineer in an automated manner the design of the drilling tool.

4. The electronic system as claimed in claim 1 wherein, the system can act as intelligent sensor in order to provide the health and status of the drilling tool, providing information and data on the historical footprint, health and current status of the drilling tool to other drilling system and software as an intelligent sensor.

5. The electronic system as claimed in claim 1 wherein, the handheld standalone device or a fixed set of cameras setup with sensors can visualize and scan the partially used or in use formation drilling tools including PDC (Polycrystalline Diamond Compact) drilling tool, roller cone drilling tool, under-reamer and other formation drilling tools; to characterize, classify and locate faults, degradation and wear and tear of the drilling tool, on the field; providing key information and insight on the health and status of the formation drilling tool.

6. The electronic system as claimed in claim 1 wherein, the handheld standalone device equipped with video and high-resolution imaging camera and positioning sensors can be guided on a measured path around the drilling tool (manually or automated by a robotic arm) such that the drilling tool is imaged and visualized in multiple views and orientation, recognizing and analyzed for its various features (blades, cutters, nozzles) including faults, degradation and wear & tear; and generates a detailed geometric engineering model of the current state of the tool.

7. The electronic system as claimed in claim 1 wherein, the handheld standalone device and camera-based application can visualize and scan the formation drilling tool to generate a detailed geometric model of the current state of the cutters, cutting elements, blades, nozzle, indenters, trimmer, gauges and other tool components such that the geometrical model can be fed as an input to an analysis software module that can perform detailed engineering analytics providing predictive, prescriptive and on field guidance on the current and future drilling ability of the tool.

8. The electronic system as claimed in claim 1 wherein, the handheld standalone device can further processes and deep scan the captured views of the tool to build an engineering geometrical model used for a detailed engineering analysis of the current and future usage of the drilling tool, which can include providing guidance, predictive and prescriptive analysis, insight and on-field decision making with respect to further usage of the drilling tool; thereby translating into significant improvement in drilling operation, efficiency, life span and cost saving.

9. The electronic system as claimed in claim 1 wherein, the handheld standalone camera or other camera and sensor based application can generate a geometric engineering model of the drilling tool; and further, when available can use a reference accurate geometrical model of a new drilling tool to mark-up and improve its generated geometric engineering model; for better and precise analysis and it is also capable to provide inputs to improve the design of the drilling tool itself and perform a root cause analysis of the faults and wear and tear on the drilling tool.

10. The electronic system as claimed in claim 1 wherein, the system which can make use of the historical measured and computed logs (Geo and petrophysical) when available; can look up and correlate the history of logs with faults and degradation detected on the drilling tool, along with the engineering analytics; determine the operating conditions and drilling actions that led to generation of the faults and degradation of the drilling tool and the drilling process as a whole; further providing guidance on correction required to improve the drilling operation or the design of the drilling tool itself; thus the drilling operation, performance, efficiency, lifespan and resistance to wear and tear can be improved.

11. An electronic system for imaging and analyzing various types of formation drilling tools on the field or in a test setup, comprising:
   a. a set of high-resolution imaging cameras for imaging various components of the formation drilling tool;
   b. sensors to profile and compute linear and angular position of the system and the various cutting elements and other supporting components of the formation drilling tool;
   c. software applications with image processing, artificial intelligence, and engineering analytics facility,
   the electronic system is a customized handheld standalone device or smart phone device with high resolution imaging capability, the electronic system is used to capture high-resolution images when a drilling tool is visually available and pulled out and the sensors are used to further profile and capture positional data of the various components of the drilling tool and the software application is used to process the captured high-resolution images and further perform analysis,
   wherein, the system can visualize in detail the wear contours of each cutters/indenters and the wear flat area (surface contour) generated on the cutters; for both chamfer as well as non-chamfer part of cutters; mounted either on a single row or double (multiple) row on a flat or spiral blade; and further uses the wear contour and wear flat contour area of each cutter to compute each cutter cutting face area and generate an interaction plot; and further compute radial segmental depth/area/volume of cut for each cutter thus computing various forces on the drill bit and cutter.

12. The electronic system as claimed in claim 11 wherein, the system can calibrate its worn cutter face-force interaction model by using a neural network; utilizing the profiled engineering model of the degraded drilling tool and acquired historical logs to train the neural network to learn and calibrate its internal non-linear model, where the neural network can be initially trained by a standard cutter-force interaction available model as a starting point; and further calculating and forecasting key drilling tool parameters including Weight on Bit/Torque on Bit/RPM(Revolutions per minute)/Temperature/Bending moment/Wear Rate/Mechanical Specific Energy for further runs.

13. The electronic system as claimed in claim 11 wherein, the system uses artificial intelligence (neural network) model to speed up convergence between computed parameters from segmental depth/area of cut (cutter force model) and applied WOB (Weight on Bit)/TOB (Torque on Bit) to the drilling tool.

14. The electronic system as claimed in claim 11 wherein, software application can visualize and can be used to scan a PDC (Polycrystalline Diamond Compact) or other drilling tool or other drilling tool; wherein the software is used to integrate visual image data and position/angular data to recognize and determine the position\location of each cutter/insert/indenter on the drilling tool and compute its cutter position, angular position, radial position, longitudinal position, angular inclination, back rake angle, side rake angle, chamfer angle, chamfer thickness, cutter radius and number of primary and secondary blades on the drilling tool and its associated angular position of the further most cutter on the blade in the drilling bit top view.

15. The electronic system as claimed in claim 11 wherein, the software application is designed to improve its image processing capability using artificial intelligence-imaging neural network which makes use of a training image generation software used for generating various transformed, scaled and augmented drilling tool images from a 3D loaded CAD model in various orientation; and further simulating various types of cutter drilling tool faults including broken cutter, bond failure, spalling, delamination, chipping, erosion bit cored, lost nozzle ring out, loss matrix, plugged nozzle, of center, washed out bit.

16. The electronic system as claimed in claim 11 wherein, the software application utilizing artificial intelligence can be trained by using field imaged drilling tool faults and degradation, or by loading a CAD (Computer Aided Design) model of the drilling tool programmatically to generate various image types of faults on the drilling tool for artificial intelligence training.

17. The electronic system as claimed in claim 11 wherein, the software application facilitates imaging and using position and inertial sensor, visualizes and profiles an in use or partially used drilling tool (PDC drilling tool or under reamer) to characterize it for fault or degradation and builds the geometrical model of the worn drilling tool and provides predictive, prescriptive, analytics and detailed on field guidance.

18. The electronic system as claimed in claim 11 wherein, the software application uses artificial intelligence module to identify the make of the drilling tool; isolate the drilling tool image from its background using image segmentation; to view the top view and to create a mask and bounding box to isolate the drilling tool image part; and quantify the number of primary/secondary blades on the drilling tool; Identify classify and isolate the nozzle on the drilling tool; to examine if any nozzle on the drilling tool are lost, plugged or are deformed or worn faulty.

19. The electronic system as claimed in claim 11 wherein, the image processing convex hull detection module in the software application is configured to: identify the number of blades (primary/secondary with type) on the blade; and use the outermost visible cutter (in top view) to calculate the start (leading) and end (lagging) angular position of each blade.

20. The electronic system as claimed in claim 11 wherein, the image processing algorithm is used to calculate the centroid of the isolated top view of the drilling tool image part.

21. The electronic system as claimed in claim 11 wherein, the sensor fusion guided positioning of the handheld stand-alone device uses its gravity sensor to ensure the device is positioned near horizontal while imaging the top view of the drill bit.

22. The electronic system as claimed in claim 11 wherein, the real time camera imaging, coupled with; external contour (mask) detection of the bit top view is supplemented with bounding box and mask identification of the bit before taking a high-resolution image.

23. The electronic system as claimed in claim 11 wherein, an image processing module/algorithm uses image processing moments and other calculations to calculate the centroid and area of the top view of the drilling tool, and further using shape matching with the original (non-degraded) image and its drilling tool contour; to determine which blade have eroded degraded in the extremities; and the module calculates the percentage radius reduction due to wear for the extremity cutters and calculates the percentage wear blade arm cutter wear and further calculates the percentage and absolute reduction in the drill hole diameter; it further calculates the maximum wear on the outermost circumference cutter.

24. The electronic system as claimed in claim 11 wherein, the image top view calculation module uses image moments to calculate the centroid and hull points to calculate outermost cutter edges, in the case where matching shape on the new drilling tool is not available; and an enhanced drilling tool external contour area and enclosing circle algorithm to mark up to the original drilling tool (radius and size) to calculate outermost cutter wear on each blade and reduction in drilling diameter.

25. The electronic system as claimed in claim 11 wherein, the image processing module aided with artificial intelligence, such that when available match the current top view of the drilling tool image (in worn degraded condition) where the initial non worn top view of the image is already profile for its blade bit body external contour and a bounding circle that encloses the outermost edges of the (blade-cutters) in the top view such that the diameter of the circle represents the stipulated size of the drilling tool and the absolute position of the outer most worn cutting edge of the drilling tool for each blade or block are computed in relation to the overlapped new drilling tool enclosing circle for further processing.

26. The electronic system as claimed in claim 11 wherein, the image processing module uses a marking point tool on the software application helps to validate and mark the outermost edges on the blade to correct or improve on the auto profiled outer cutting edges of the drilling tool; to refine the outer and closing circle or ring for the drilling tool.

27. The electronic system as claimed in claim 11 wherein, a handheld standalone device image and position tracking module implements an image processing and sensor fusion algorithm to measure and track the linear, angular and gravitational alignment of the device; along with utilizing image processing to view and compute the position of the drilling tool pin or reference center (drilling tool origin); and identifies and computes the center of the various cutting elements (PDC (Polycrystalline Diamond Compact) cutters and others); in multiple acquired images at different guided device position; thus co-relating from the multiple set of images and tracked position the absolute position of each cutting element in terms of angular position, radial position, longitudinal position, angular inclination, back rake angle, side rake angle, chamfer angle, chamfer thickness and cutter radius.

28. The electronic system as claimed in claim 11 wherein, a software 3D (3 Dimensional) training application can be used to classify mask and image segment in 3D, polygon bounding points and areas of interest for the drilling tool marking out degradation, faults and wear and tear; and capable of generating mask and bounding box from 3D projection to 2D images; at various programmed or random orientation to train the artificial intelligence system for various drilling tool faults.

29. The electronic system as claimed in claim 11 wherein, a handheld standalone device image and position tracking module that implements an image processing and sensor fusion algorithm to measure and track the linear, angular and gravitational alignment of the device; along with utilizing image processing to view and compute the position of the drilling tool pin or reference center (drilling tool origin) and identifies and computes the absolute position of the wear contour and wear flat contour for each cutter; from multiple acquired images at different guided and recorded device position; by co-relating from the previously computed outer most cutting edge for each blade/block and multiple set of images and tracked positions using geometric mathematics.

30. The electronic system as claimed in claim 11 wherein, a cloud based or desktop application implementing an algorithm that takes as input absolute position of cutter wear face and cutter wear flat contours for all the cutters on the drilling tool as discretized irregular geometries; to further segment and compute the interaction profile of the each cutting cutters (elements) to translate participating cutting face area and wear flat area into various forces on the cutter (penetration, drag, side and others); thus translating and computing the weight on bit and torque on bit required for the irregularly worn or degraded drilling tool.

31. The electronic system as claimed in claim 11 wherein, various imaged, sensed and computed wear value and wear rate of each cutting element and other computed engineering parameters, further serve as an input to an analysis software module that can perform detailed engineering analytics providing predictive, prescriptive and on field guidance on the current and future drilling ability of the tool further providing insight and on-field decision making with respect to further usage of the drilling tool; thereby translating into significant improvement in drilling operation, efficiency, life span and cost saving.

32. The electronic system as claimed in claim 11 wherein, computed geometric model, health status and various engineering parameters along with the wear and tear status of each cutting element, accumulated for multiple runs of the same type of the drilling tool, serve as input to a software module to help automatically analyze and suggest improvement in the future design of the drilling tool.

* * * * *